US012143742B2

(12) United States Patent
Yamashita

(10) Patent No.: US 12,143,742 B2
(45) Date of Patent: Nov. 12, 2024

(54) SOLID-STATE IMAGING ELEMENT

(71) Applicant: Sony Semiconductor Solutions Corporation, Kanagawa (JP)

(72) Inventor: Tomonori Yamashita, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 60 days.

(21) Appl. No.: 17/926,789

(22) PCT Filed: May 11, 2021

(86) PCT No.: PCT/JP2021/017808
§ 371 (c)(1),
(2) Date: Nov. 21, 2022

(87) PCT Pub. No.: WO2021/251041
PCT Pub. Date: Dec. 16, 2021

(65) Prior Publication Data
US 2023/0247324 A1 Aug. 3, 2023

(30) Foreign Application Priority Data

Jun. 8, 2020 (JP) .................................. 2020-099445

(51) Int. Cl.
H04N 25/77 (2023.01)
H04N 25/51 (2023.01)
(Continued)

(52) U.S. Cl.
CPC ............ *H04N 25/77* (2023.01); *H04N 25/51* (2023.01); *H04N 25/53* (2023.01); *H04N 25/57* (2023.01)

(58) Field of Classification Search
CPC ........ H04N 25/51; H04N 25/53; H04N 25/57; H04N 25/77; H04N 25/772; H04N 25/78;
(Continued)

(56) References Cited

U.S. PATENT DOCUMENTS

2013/0256512 A1* 10/2013 Shioya ................ H04N 23/741
250/208.1
2017/0201693 A1* 7/2017 Sugizaki ............... H04N 23/71
(Continued)

FOREIGN PATENT DOCUMENTS

JP  2018148541 A  9/2018
JP  2019165313 A  9/2019
(Continued)

OTHER PUBLICATIONS

International Search Report (PCT/ISA/210), International Application No. PCT/JP2021/017808, dated Aug. 10, 2021.

*Primary Examiner* — Lin Ye
*Assistant Examiner* — Chriss S Yoder, III
(74) *Attorney, Agent, or Firm* — Michael Best & Friedrich LLP

(57) ABSTRACT

Solid-state imaging elements are disclosed. In one example, a solid-state imaging element includes a plurality of pixels. A pixel signal line transmits a pixel signal of a pixel, a reference signal line transmits a reference signal to be compared with the pixel signal, a first comparator outputs a first output signal according to the pixel signal on the basis of a voltage difference between the pixel signal and the reference signal, a second comparator outputs a second output signal according to the pixel signal on the basis of the voltage difference between the pixel signal and the reference signal, a first capacitor unit between the pixel signal line or the reference signal line and the first comparator and set to a first gain, and a second capacitor unit between the pixel signal line or the reference signal line and the second comparator and set to a second gain.

15 Claims, 20 Drawing Sheets

(51) Int. Cl.
*H04N 25/53* (2023.01)
*H04N 25/57* (2023.01)

(58) Field of Classification Search
CPC ...... H04N 25/79; H03M 1/123; H03M 1/188; H03M 1/56
See application file for complete search history.

(56) References Cited

U.S. PATENT DOCUMENTS

2019/0191119 A1\* 6/2019 Takamoto ............ H04N 25/772
2020/0053308 A1 2/2020 Niwa

FOREIGN PATENT DOCUMENTS

| WO | 2016013412 A1 | 1/2016 | |
| WO | WO-2017203752 A1 \* | 11/2017 | ............... B60R 1/00 |
| WO | 2020031439 A1 | 2/2020 | |

\* cited by examiner

FIG. 13

|  | FIRST EXPOSURE TIME (LONG EXPOSURE) | SECOND EXPOSURE TIME (SHORT EXPOSURE) |
|---|---|---|
| Ga(Low Gain) | FIRST IMAGE DATA | SECOND IMAGE DATA (FOR HIGH ILLUMINANCE) |
| Gb(High Gain) | THIRD IMAGE DATA (FOR LOW ILLUMINANCE) | FOURTH IMAGE DATA |

FIG. 14

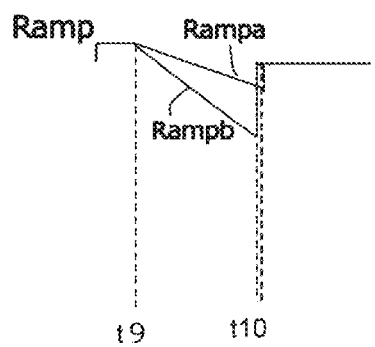

FIG. 15

|  | Rampa (LOW ILLUMINANCE) | Rampb (HIGH ILLUMINANCE) |
|---|---|---|
| Ga(Low Gain) | FIRST IMAGE DATA | SECOND IMAGE DATA (FOR HIGH ILLUMINANCE) |
| Gb(High Gain) | THIRD IMAGE DATA (FOR LOW ILLUMINANCE) | FOURTH IMAGE DATA |

Cvsla or Cvslb

SOLID-STATE IMAGING ELEMENT

TECHNICAL FIELD

The present disclosure relates to a solid-state imaging element.

BACKGROUND ART

There is a complementary metal oxide semiconductor (CMOS) image sensor that performs analogue-to-digital (AD) conversion on a pixel signal by comparing an analog pixel signal with a linearly changing reference signal by a comparator and counting a time until the reference signal crosses the pixel signal.

CITATION LIST

Patent Documents

Patent Document 1: Japanese Patent Application Laid-Open No. 2018-148541
Patent Document 1: Japanese Patent Application Laid-Open No. 2019-165313

SUMMARY OF THE INVENTION

Problems to be Solved by the Invention

However, in an AD converter of the conventional image sensor, a dynamic range of the comparator is relatively narrow, and it is difficult to perform AD conversion on irradiation light with a wide illuminance.

Thus, an object of the present disclosure is to provide a solid-state imaging element including an AD converter having a wide dynamic range.

Solutions to Problems

A solid-state imaging element according to one aspect of the present disclosure includes: a pixel unit including a plurality of pixels; a pixel signal line that transmits a pixel signal of the pixel; a reference signal line that transmits a reference signal to be compared with the pixel signal; a first comparator that outputs a first output signal according to the pixel signal on the basis of a voltage difference between the pixel signal and the reference signal; a second comparator that outputs a second output signal according to the pixel signal on the basis of the voltage difference between the pixel signal and the reference signal; a first capacitor unit provided between the pixel signal line or the reference signal line and the first comparator and set to a first gain; and a second capacitor unit provided between the pixel signal line or the reference signal line and the second comparator and set to a second gain.

The first capacitor unit may include a first input capacitive element provided between the reference signal line and the first comparator, and a second input capacitive element provided between the pixel signal line and the first comparator, and the second capacitor unit may include a third input capacitive element provided between the reference signal line and the second comparator, and a fourth input capacitive element provided between the pixel signal line and the second comparator.

A capacitance ratio between the first input capacitive element and the second input capacitive element may be different from a capacitance ratio between the third input capacitive element and the fourth input capacitive element.

Capacitances of the first and third input capacitive elements may be substantially equal, and capacitances of the second and fourth input capacitive elements may be different from each other.

A gain of the first capacitor unit may be determined by the capacitance ratio between the first input capacitive element and the second input capacitive element, and a gain of the second capacitor unit may be determined by the capacitance ratio between the third input capacitive element and the fourth input capacitive element.

One end of each of the first and third input capacitive elements may be commonly connected to the reference signal line, one end of each of the second and fourth input capacitive elements may be commonly connected to the pixel signal line, the first comparator may include a first transistor having a gate commonly connected to the other ends of the first and second input capacitive elements, and the second comparator may include a second transistor having a gate commonly connected to the other ends of the third and fourth input capacitive elements.

The first comparator may further include a first constant current source connected to one end of the first transistor, and may output the first output signal from between the first transistor and the first constant current source, and the second comparator may further include a second constant current source connected to one end of the second transistor, and may output the second output signal from between the second transistor and the second constant current source.

The first comparator may further include a first constant current source connected to one end of the first transistor, a third transistor having one end connected to the first constant current source, and a first mirror circuit connected to the other ends of the first and third transistors, and may output the first output signal from between the third transistor and the first mirror circuit. The second comparator may further include a second constant current source connected to one end of the second transistor, a fourth transistor having one end connected to the second constant current source, and a second mirror circuit connected to the other ends of the first and fourth transistors, and may output the second output signal from between the fourth transistor and the second mirror circuit.

The first comparator may include the first transistor having a gate connected to the first input capacitive element and one end connected to the second input capacitive element, and the second comparator may include the second transistor having a gate connected to the third input capacitive element and one end connected to the fourth input capacitive element.

The first and third input capacitive elements are commonly connected to the reference signal line, and one ends of the first and second transistors may receive the pixel signal via the second and fourth input capacitive elements, respectively.

A reference signal generator that supplies the same reference signal to the first and third input capacitive elements may be further included.

A signal processing circuit that selects the first output signal or the second output signal according to an illuminance of irradiation light to the pixel unit and outputs the selected signal as image data may be further included.

A controller that changes an exposure time of the pixel unit according to the illuminance of the irradiation light to the pixel unit may be further included.

A controller that controls a slope of the reference signal according to the illuminance of the irradiation light to the pixel unit may be further included.

A controller that controls the first gain or the second gain according to the illuminance of the irradiation light to the pixel unit may be further included.

A signal processing circuit that acquires the illuminance of the irradiation light to the pixel unit and a controller that sets the first or second gain according to the illuminance may be further included, the pixel unit may execute imaging with the set first or second gain to generate the pixel signal, and the signal processing circuit may convert the pixel signal to generate image data.

One end of each of the first and third input capacitive elements may be commonly connected to the reference signal line, one end of each of the second and fourth input capacitive elements may be commonly connected to the pixel signal line, the first comparator may include a first transistor having a gate connected to the other end of the first input capacitive element and a third transistor having a gate connected to the other end of the second input capacitive element, and the second comparator may include a second transistor having a gate connected to the other end of the third input capacitive element and a fourth transistor having a gate connected to the other end of the fourth input capacitive element.

BRIEF DESCRIPTION OF DRAWINGS

FIG. 13 is a table illustrating a relationship between an exposure time and an input capacitance gain of the solid-state imaging element according to Modification FIG. 14 is a timing diagram illustrating an operation example of the solid-state imaging element according to Modification 3.

FIG. 15 is a table illustrating a combination of a reference signal and an input capacitance gain according to Modification 3.

MODE FOR CARRYING OUT THE INVENTION

Figure 1:
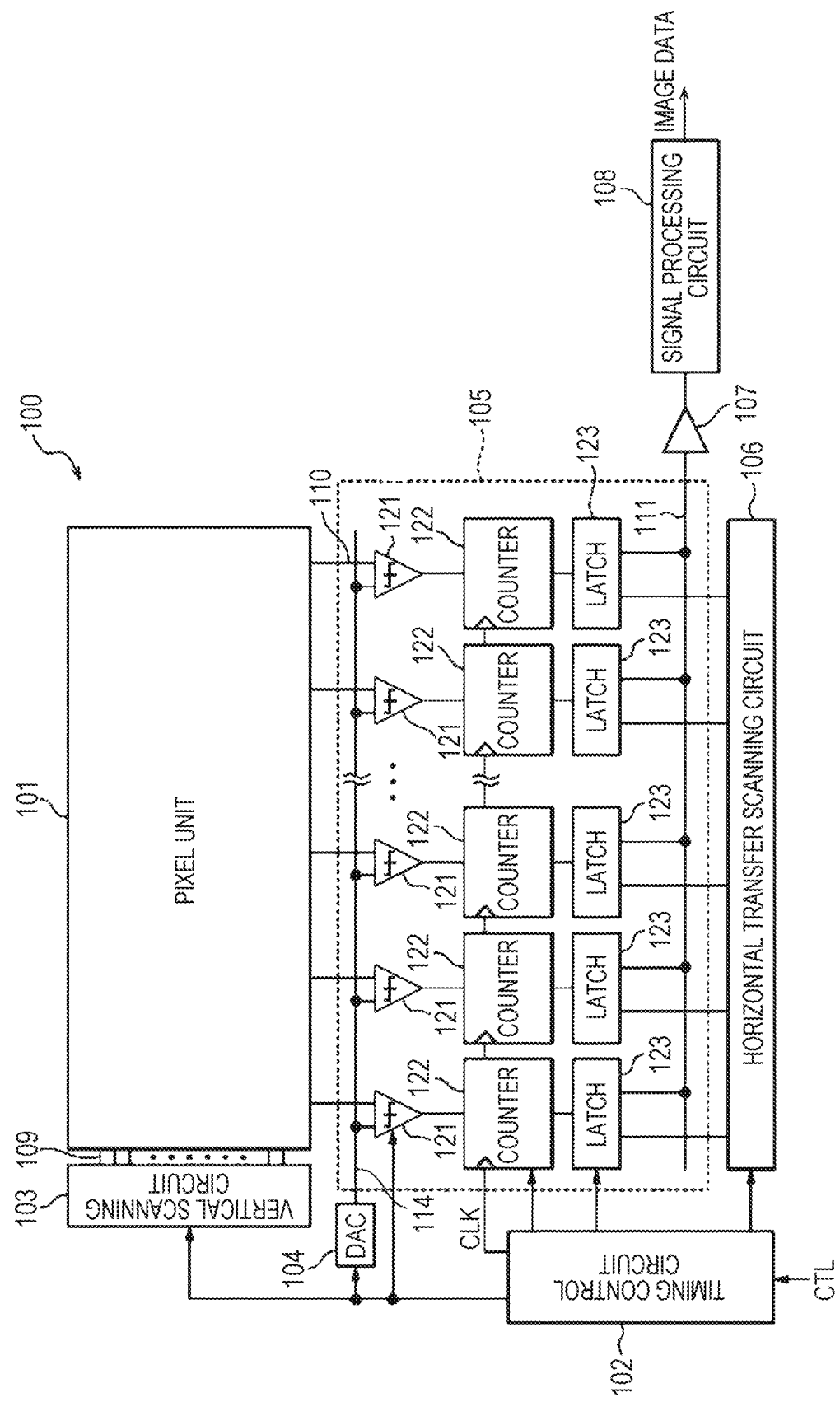
FIG. 1 is a block diagram illustrating a configuration example of a solid-state imaging element according to a first embodiment.

Hereinafter, specific embodiments to which the present technology is applied will be described in detail with reference to the drawings. The drawings are schematic or conceptual ones, and, for example, the ratios of various portions are not necessarily the same as the reality. In the specification and the drawings, elements similar to those previously described with reference to the previously-discussed drawings are assigned the respective same reference characters, and the detailed description thereof is omitted as appropriate.

First Embodiment

FIG. 1 is a block diagram illustrating a configuration example of a solid-state imaging element 100 according to a first embodiment. The solid-state imaging element 100 includes a pixel unit 101, a timing control circuit 102, a vertical scanning circuit 103, a digital-analog conversion device (DAC) 104, an analog-digital conversion device (ADC) group 105, a horizontal transfer scanning circuit 106, an amplifier circuit 107, and a signal processing circuit 108.

In the pixel unit 101, unit pixels (hereinafter also simply referred to as a pixel) including photoelectric conversion elements that photoelectrically convert incident light into a charge amount corresponding to a light amount thereof are arranged in a matrix form. A specific circuit configuration of the unit pixel will be described later with reference to FIG. 2. Furthermore, in the pixel unit 101, a pixel drive line 109 is wired for each row along a left-right direction (pixel array direction of pixel row/horizontal direction) in the drawing, and a vertical signal line 110 is wired for each column along an up-down direction (pixel array direction of pixel column/vertical direction) in the drawing with respect to a pixel array in the matrix form. One end of the pixel drive line 109 is connected to an output terminal corresponding to each row of the vertical scanning circuit 103. Note that, in FIG.

1, although one pixel drive line 109 is illustrated for each pixel row, two or more pixel drive lines 109 may be provided in each pixel row.

The timing control circuit 102 includes a timing generator (not illustrated) that generates various timing signals. The timing control circuit 102 performs drive control of the vertical scanning circuit 103, the DAC 104, the ADC group 105, the horizontal transfer scanning circuit 106, and the like on the basis of various timing signals generated by the timing generator on the basis of a control signal and the like provided from the outside.

The vertical scanning circuit 103 includes a shift register, an address decoder, and the like. In this embodiment, although a specific configuration is not shown, the vertical scanning circuit 103 includes a readout scanning system and a sweep scanning system.

The readout scanning system sequentially performs selective scanning in units of rows for unit pixels from which a signal is read out. On the other hand, with respect to the readout row to be subjected to the readout scanning by the readout scanning system, the sweep scanning system performs sweep scanning in which unwanted charges are swept (reset) from the photoelectric conversion element of the unit pixel of the readout row earlier than the readout scanning by an amount of time corresponding to the shutter speed. Through the unwanted-charge sweeping (resetting) performed by the sweep scanning system, the so-called electronic shutter operation is performed. The electronic shutter operation as used herein refers to an operation for dumping light charges of the photoelectric conversion elements and re-starting exposure (i.e., re-starting accumulation of light charges). A signal read through the readout operation in the readout scanning system corresponds to the amount of light entering after the immediately previous readout operation or the electronic shutter operation. Then, a period between the readout timing of the immediately preceding readout operation or the sweep timing of the electronic shutter operation and the readout timing of the present readout operation is an accumulation time (exposure time) of light charges in the unit pixel.

Pixel signals VSL output from unit pixels of a pixel row selected and scanned by the vertical scanning circuit 103 are supplied to the ADC group 105 via a plurality of the vertical signal lines 110 corresponding to each column.

The DAC 104 as a reference signal generator generates a reference signal RAMP that is a signal of a linearly changing ramp waveform, and supplies the reference signal RAMP to the ADC group 105. The DAC 104 is commonly connected to a plurality of comparators 121 via the reference signal line 114, and supplies the same reference signal RAMP to the plurality of comparators 121. The reference signal line 114 transmits the reference signal RAMP to the plurality of comparators 121.

Figure 2:
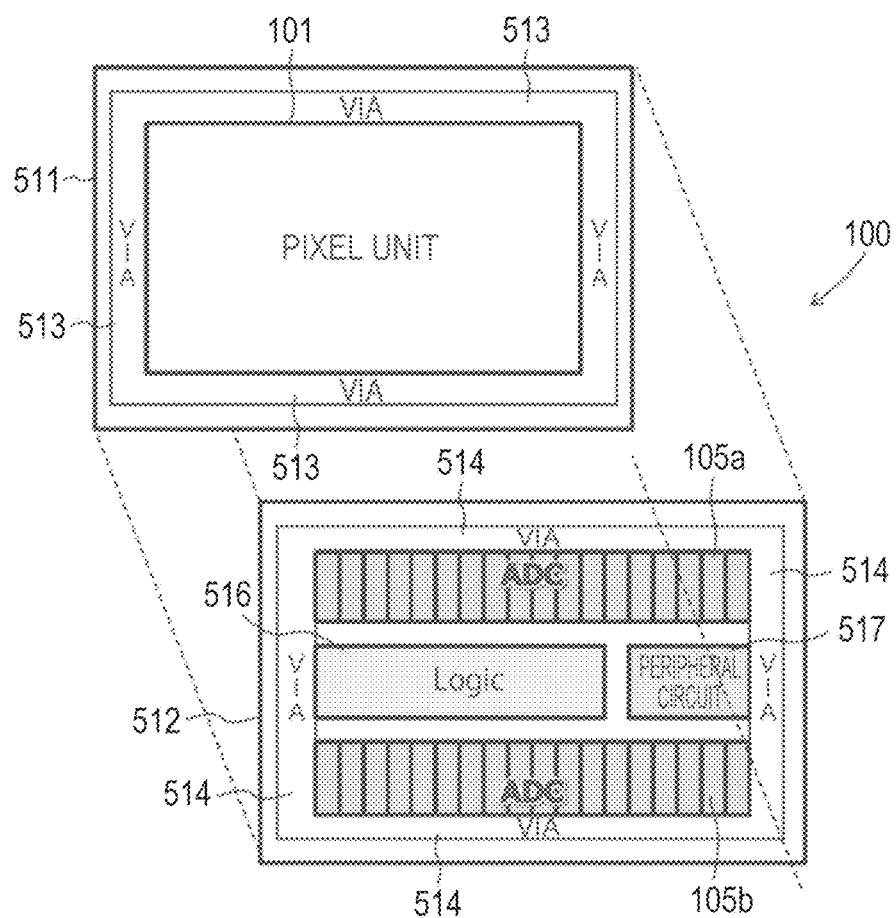
FIG. 2 is a conceptual diagram illustrating an example of the solid-state imaging element in which a semiconductor chip of a pixel unit and a semiconductor chip of a processing circuit are stacked.
Figure 3:
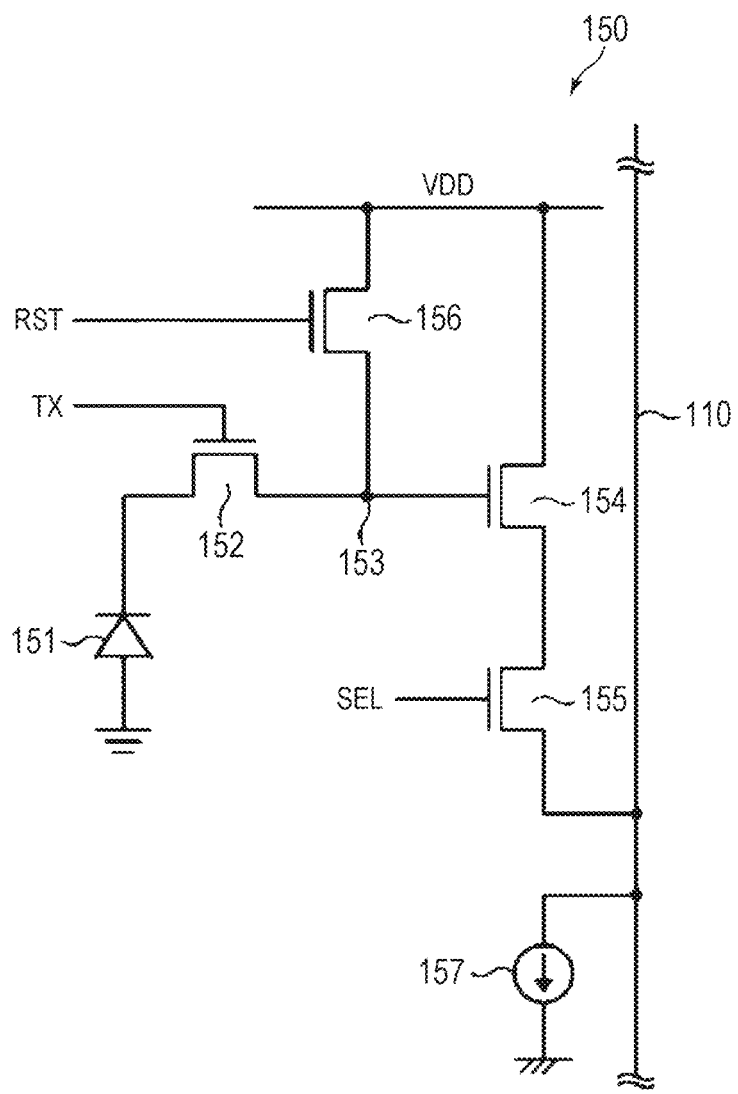
FIG. 3 is a circuit diagram illustrating a configuration example of a pixel provided in the pixel unit.

The ADC group 105 includes the plurality of comparators 121, a plurality of counters 122, and a plurality of latch circuits 123. Note that although only one ADC group 105 is illustrated in FIG. 1, the ADC group 105 is divided into a plurality of ADC groups 105a and 105b as illustrated in FIG. 2 or 3. A configuration of the ADC groups 105a and 105b will be described later.

The comparator 121, the counter 122, and the latch circuit 123 are each provided corresponding to the pixel column of the pixel unit 101, and constitute the ADC.

The comparator 121 compares a voltage of a signal obtained by adding the pixel signal VSL output from each pixel and the reference signal RAMP via capacitance with a predetermined reference voltage, and supplies an output signal indicating a comparison result to the counter 122.

The counter 122 counts the time until the voltage of the signal obtained by adding the pixel signal VSL and the reference signal RAMP via the capacitance exceeds a predetermined reference voltage on the basis of the output signal from the comparator 121, thereby converting an analog pixel signal into a digital pixel signal represented by a count value. The counter 122 supplies the count value to the latch circuit 123.

The latch circuit 123 holds the count value supplied from the counter 122. Furthermore, the latch circuit 123 performs correlated double sampling (CDS) by taking a difference between the count value of a D-phase corresponding to the pixel signal at a signal level and the count value of a P-phase corresponding to the pixel signal at a reset level.

The horizontal transfer scanning circuit 106 includes a shift register, an address decoder, and the like, and selectively scans circuit portions corresponding to the pixel columns of the ADC group 105 in order. By the selective scanning by the horizontal transfer scanning circuit 106, the digital pixel signals held in the latch circuit 123 are transferred to the amplifier circuit 107 via a horizontal transfer line 111 in order.

The amplifier circuit 107 amplifies the digital pixel signal supplied from the latch circuit 123 and supplies the amplified digital pixel signal to the signal processing circuit 108.

The signal processing circuit 108 performs predetermined signal processing on the digital pixel signal supplied from the amplifier circuit 107 to generate two-dimensional image data. For example, the signal processing circuit 108 performs correction of vertical line defects and point defects or signal clamping or performs digital signal processing such as parallel-serial conversion, compression, encoding, addition, averaging, and an intermittent operation. The signal processing circuit 108 outputs the generated image data to a device in a later stage.

Note that the solid-state imaging element 100 illustrated in FIG. 1 may be configured as one semiconductor chip as a whole, or may be constituted of a plurality of semiconductor chips. In a case where the solid-state imaging element 100 is configured as a plurality of semiconductor chips, the pixel unit 101 and the other processing circuits may be formed as separate semiconductor chips 511 and 512, respectively, and the semiconductor chip 511 and the semiconductor chip 512 may be stacked.

For example, FIG. 2 is a conceptual diagram illustrating an example of the solid-state imaging element 100 in which the semiconductor chip 511 of the pixel unit 101 and the semiconductor chip 512 of the processing circuit are stacked. As illustrated in FIG. 2, the solid-state imaging element 100 includes the two stacked semiconductor chips 511 and 512. Note that the number of stacked semiconductor chips may be three or more.

The semiconductor chip 511 includes the pixel unit 101 formed on a semiconductor substrate. The semiconductor chip 512 includes the ADC groups 105a and 105b formed on another semiconductor substrate, a logic circuit 516, and a peripheral circuit 517. The ADC group 105 is divided into a plurality of portions (105a, 105b), and is set to have different gains, for example. The logic circuit 516 includes the timing control circuit 102, the vertical scanning circuit 103, the DAC 104, the horizontal transfer scanning circuit 106, and the like. The peripheral circuit 517 includes the processing circuit 108 and the like.

Each pixel of the pixel unit 101 of the semiconductor chip 511 and an element of the processing circuit (105a, 105b, 516, 517) of the semiconductor chip 512 may be electrically connected using, for example, a through electrode such as Through Silicon Via (TSV) provided in via regions 513 and 514. The ADC groups 105a and 105b can transmit and receive signals to and from the pixel unit 101 via the TSV. Furthermore, both semiconductor chips may be applied (Cu—Cu bonding) so that a wiring of the semiconductor chip 511 and a wiring of the semiconductor chip 512 are brought into contact with each other. In addition, although not illustrated, the pixel unit 101 and a part of the processing circuit (105a, 105b, 516, 517) may be configured as one semiconductor chip 511, and other configurations may be configured as the other semiconductor chip 512.

FIG. 3 is a circuit diagram illustrating a configuration example of a pixel 150 provided in the pixel unit 101. The pixel 150 includes, for example, a photodiode 151 as a photoelectric conversion element, and four transistors including a transfer transistor 152, an amplification transistor 154, a selection transistor 155, and a reset transistor 156 as active elements with respect to the photodiode 151.

The photodiode 151 photoelectrically converts incident light into charges (electrons in this case) of an amount corresponding to the amount of light.

The transfer transistor 152 is connected between the photodiode 151 and a floating diffusion (FD) 153. When the transfer transistor 152 is turned on by a drive signal TX supplied from the vertical scanning circuit 103, the transfer transistor 152 transfers the charge accumulated in the photodiode 151 to the FD 153.

A gate of the amplification transistor 154 is connected to the FD 153. The amplification transistor 154 is connected to the vertical signal line 110 via the selection transistor 155, and forms a source follower with a constant current source 157 outside the pixel unit 101. When the selection transistor 155 is turned on by a drive signal SEL supplied from the vertical scanning circuit 103, the amplification transistor 154 amplifies the potential of the FD 153 and outputs a pixel signal indicating a voltage corresponding to the potential to the vertical signal line 110. Then, the pixel signal output from each of the pixels 150 is supplied to each of the comparators 121 of the ADC group 105 via the vertical signal line 110.

The reset transistor 156 is connected between a power supply VDD and the FD 153. When the reset transistor 156 is turned on by a drive signal RST supplied from the vertical scanning circuit 103, the potential of the FD 153 is reset to the potential of the power supply VDD.

Figure 4:
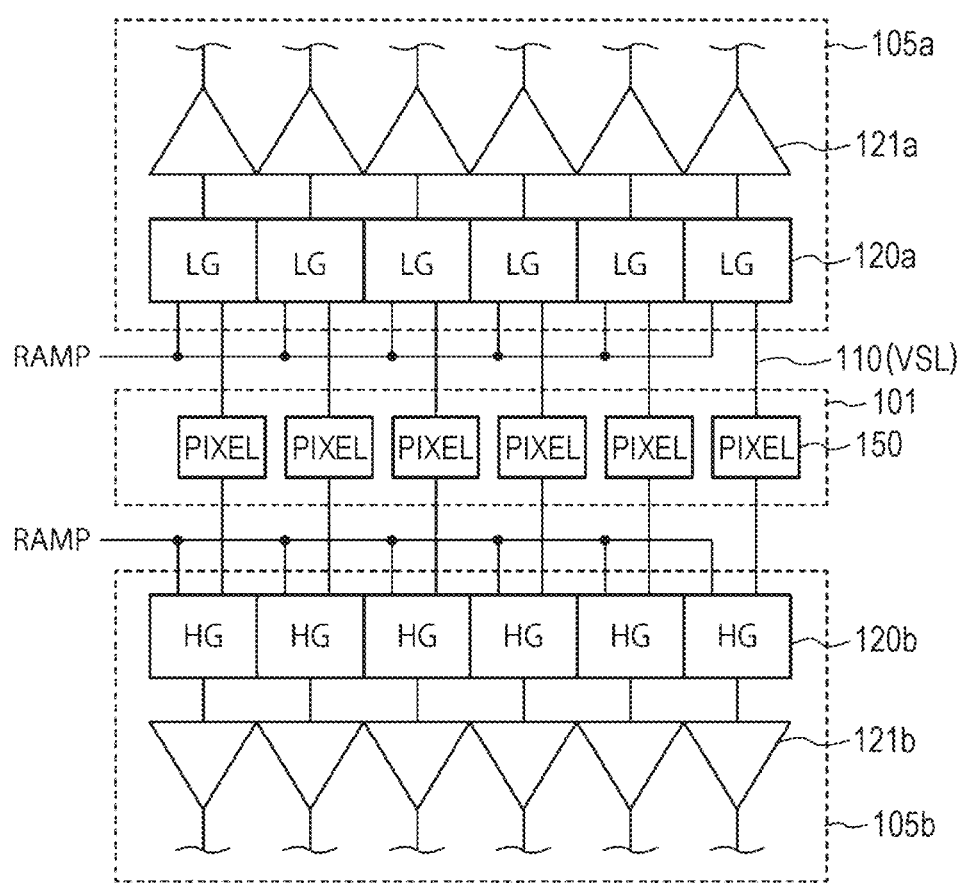
FIG. 4 is a block diagram illustrating an example of a configuration of the pixel unit and an ADC group.
Figure 5:
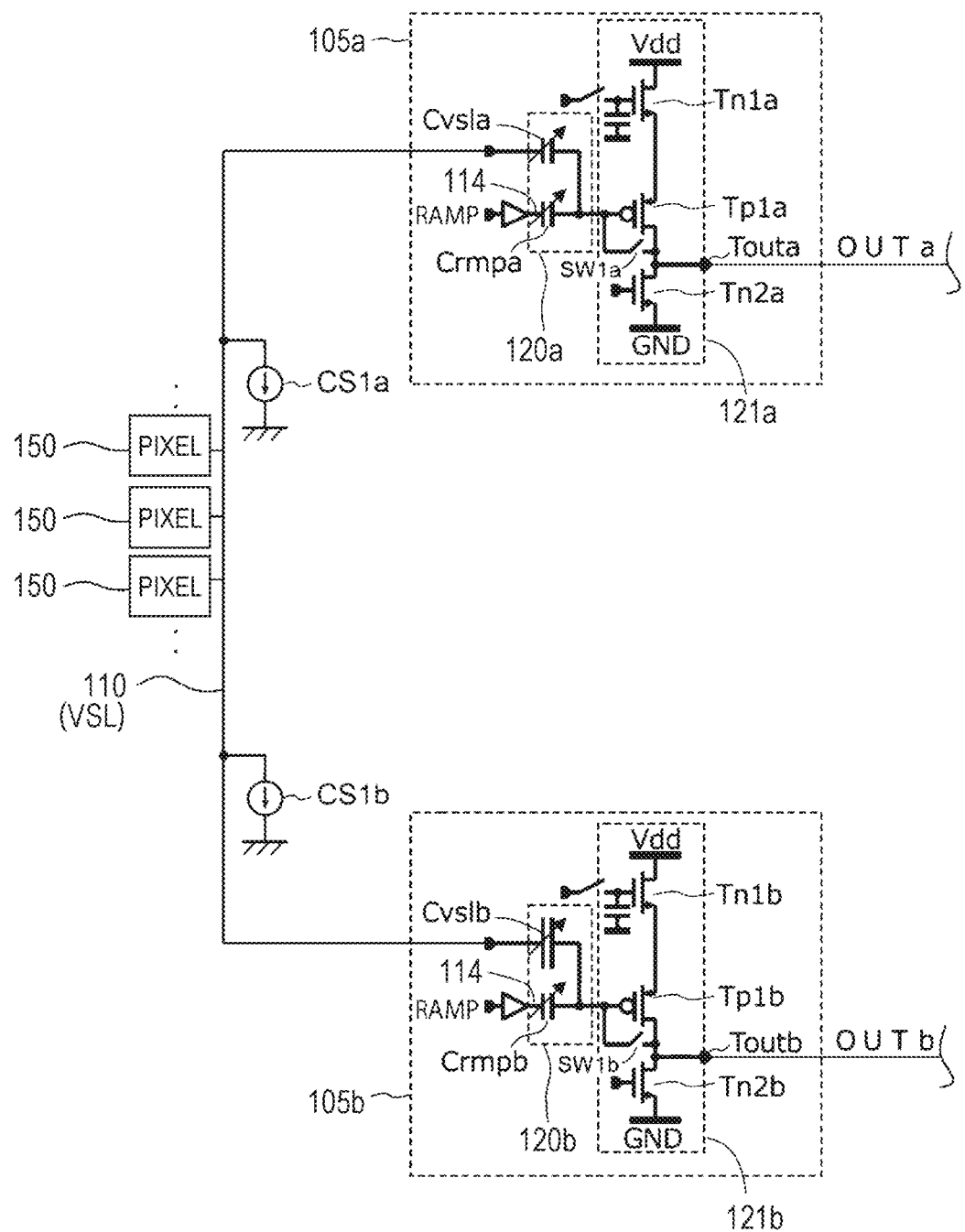
FIG. 5 is a diagram illustrating an example of an internal configuration of a capacitor unit and a comparator.

FIG. 4 is a block diagram illustrating an example of the configuration of the pixel unit 101 and the ADC groups 105a and 105b. Each pixel column of the plurality of pixels 150 included in the pixel unit 101 is connected to both the ADC groups 105a and 105b via the vertical signal line 110. The vertical signal line 110 is provided for each pixel column including the plurality of pixels 150, and transmits the same pixel signal VSL from the pixel 150 selected from the pixel column. Note that, although FIG. 4 illustrates only one pixel 150 for the vertical signal line 110, the vertical signal line 110 is shared by the plurality of pixels 150 in the pixel column as illustrated in FIG. 5.

The ADC group 105a includes a plurality of capacitor units 120a and a plurality of comparators 121a provided corresponding to the respective pixel columns. The capacitor unit 120a is connected to the vertical signal line 110, and transmits the pixel signal VSL from the pixel 150 to the comparator 121a. At this time, the capacitance of the capacitor unit 120a can be changed in order to set an input capacitance gain of the pixel signal VSL. The comparator 121a receives the pixel signal VSL via the capacitor unit 120a, and outputs a result of comparison between the pixel signal VSL and the reference signal RAMP to the counter 122 in FIG. 1.

The ADC group 105b includes a plurality of capacitor units 120b and a plurality of comparators 121b provided corresponding to the respective pixel columns. The capacitor unit 120b is connected to the vertical signal line 110, and transmits the pixel signal VSL from the pixel 150 to the comparator 121b. At this time, the capacitance of the capacitor unit 120b can be changed in order to set the input capacitance gain of the pixel signal VSL. The comparator 121b receives the pixel signal VSL via the capacitor unit 120b, and outputs the result of comparison between the pixel signal VSL and the reference signal RAMP to the counter 122 in FIG. 1.

The capacitor units 120a and 120b have different input capacitance gains. For example, the capacitor unit 120a has a relatively low input capacitance gain, and the capacitor unit 120b has a relatively high input capacitance gain. The input capacitance gain is a transmittance of the pixel signal VSL with respect to the reference signal RAMP. In a case where the input capacitance gain is high, the transmittance of the pixel signal VSL increases, and the solid-state imaging element 100 can accurately detect even low-illuminance irradiation light. In a case where the input capacitance gain is low, the transmittance of the pixel signal VSL decreases, and the solid-state imaging element 100 can detect high-illuminance irradiation light in a short time. The input capacitance gain can be controlled by changing a capacitance ratio between the capacitive element that transmits the pixel signal VSL and the capacitive element that transmits the reference signal RAMP.

The capacitor unit 120a is used to detect high-illuminance irradiation light by having a relatively low input capacitance gain. The capacitor unit 120b is used to detect low-illuminance irradiation light by having a relatively high input capacitance gain.

As described above, each of the pixels 150 is connected to the plurality of ADC groups 105a and 105b having different input capacitance gains via the corresponding vertical signal line 110.

FIG. 5 is a diagram illustrating an example of an internal configuration of the capacitor units 120a and 120b and the comparators 121a and 121b.

The capacitor unit 120a as the first capacitor unit is provided between the vertical signal line 110 or the reference signal line 114 and the comparator 121a, and is set to a low gain as a first gain. The capacitor unit 120a includes an input capacitive element Crmpa and an input capacitive element Cvsla. The input capacitive element Crmpa as the first input capacitive element is provided between the reference signal line 114 and a gate of a transistor Tp1a of the comparator 121a. The input capacitive element Cvsla as the second input capacitive element is provided between the vertical signal line 110 and the comparator 121a.

That is, one ends of the input capacitive elements Crmpa and Cvsla are connected to the vertical signal line 110 and the reference signal line 114, respectively. The other ends of the input capacitive elements Crmpa and Cvsla are commonly connected to the gate of the transistor Tp1a.

The capacitor unit 120b as the second capacitor unit is provided between the vertical signal line 110 or the reference signal line 114 and the comparator 121b, and is set to a high gain as a second gain. The second gain is higher than the first gain. The capacitor unit 120b includes an input capacitive element Crmpb and an input capacitive element Cvslb. The input capacitive element Crmpb as the third input capacitive element is provided between the reference signal line 114 and a gate of a transistor Tp1b of the comparator 121b. The input capacitive element Cvslb as the fourth input capacitive element is provided between the vertical signal line 110 and the comparator 121b.

That is, one ends of the input capacitive elements Crmpb and Cvslb are connected to the vertical signal line 110 and the reference signal line 114, respectively. The other ends of the input capacitive elements Crmpb and Cvslb are commonly connected to the gate of the transistor Tp1b.

In addition, the capacitor units 120a and 120b share the corresponding reference signal line 114 and share the corresponding vertical signal line 110. Therefore, one ends of the input capacitive elements Crmpa and Crmpb are commonly connected to the reference signal line 114. One ends of the input capacitive elements Cvsla and Cvslb are commonly connected to the vertical signal line 110 via the vertical signal line 110.

In the present embodiment, although the capacitances of the input capacitive elements Crmpa and Crmpb are substantially equal to each other, the capacitances of the input capacitive elements Cvsla and Cvslb are different from each other. Thus, a capacitance ratio between the input capacitive element Crmpa and the input capacitive element Cvsla (input capacitance gain Ga of the capacitor unit 120a) is different from a capacitance ratio between the input capacitive element Crmpb and the input capacitive element Cvslb (input capacitance gain Gb of the capacitor unit 120b). The input capacitance gain Ga of the capacitor unit 120a is determined by a capacitance ratio (for example, Cvsla/Cvsla+Crmpa) of the input capacitive element Cvsla to the input capacitive element Crmpa. The input capacitance gain Gb of the capacitor unit 120b is determined by a capacitance ratio (for example, Cvslb/Cvslb+Crmpb) of the input capacitive element Cvslb to the input capacitive element Crmpb.

In the present embodiment, for example, since the input capacitive element Cvslb is larger than the input capacitive element Cvsla, the input capacitance gain Gb of the capacitor unit 120b is set to be larger than the input capacitance gain Ga of the capacitor unit 120a.

The input capacitive elements Crmpa, Crmpb, Cvsla, and Cvslb are variable capacitive elements. For example, the input capacitive elements Crmpa, Crmpb, Cvsla, and Cvslb are adjusted by changing the number of elements of the same capacitance connected in parallel or in series by trimming, a switch (not illustrated), or the like. Trimming or switching of the input capacitive elements Crmpa, Crmpb, Cvsla, and Cvslb is only required to execute at the time of manufacturing or shipping the solid-state imaging element 100. Alternatively, as described with reference to FIG. 11, the switching of the input capacitive elements Crmpa, Crmpb, Cvsla, and Cvslb may be executed by switching switches SWc1 and SWc2 on the basis of the illuminance of the irradiation light.

The comparator 121a as the first comparator is a single-type amplifier that is connected to the capacitor unit 120a and outputs an output signal OUTa according to the pixel signal VSL (amplified) on the basis of a voltage difference between the pixel signal VSL and the reference signal RAMP.

The comparator 121a includes an n-type transistor Tn1a, a p-type transistor Tp1a, and an n-type transistor Tn2a. The transistors Tn1a, Tp1a, and Tn2a are connected in series between a power supply Vdd and a ground GND in this order.

A drain of the transistor Tn1a is connected to the power supply Vdd, and a source thereof is connected to a source of the transistor Tp1a. The transistor Tn1a functions as a low dropout (LDO) linear regulator.

As described above, the gate of the transistor Tp1a as the first transistor is commonly connected to the other ends of the input capacitive elements Crmpa and Cvsla. A source of the transistor Tp1a is connected to a source of the transistor Tn1a, and a drain of the transistor Tp1a is connected to the output terminal and a drain of the transistor Tn2a. When an addition signal of the pixel signal VSL from the capacitor unit 120a and the reference signal RAMP from the DAC 104 exceeds a reference voltage, the transistor Tp1a is changed from a conductive state to a non-conductive state, and inverts a level of the output signal OUTa. That is, the transistor Tp1a functions as an amplifier that amplifies and detects a level of the pixel signal VSL.

The transistor Tn2a functions as a constant current source for causing a constant current to flow through the transistor Tp1a.

An AZ switch SW1a is connected between the gate of the transistor Tp1a and an output terminal Touta, and performs an auto-zero operation by equalizing a potential between the gate of the transistor Tp1a and the output terminal Touta before the pixel signal VSL is detected.

With such a configuration, the comparator 121a outputs the output signal OUTa as the first output signal from an output unit between the transistors Tp1a and Tn2a.

The comparator 121b as the second comparator is connected to the capacitor unit 120b and outputs an output signal OUT2 according to the pixel signal VSL on the basis of the voltage difference between the pixel signal VSL and the reference signal RAMP.

The comparator 121b includes an n-type transistor Tn1b, a p-type transistor Tp1b, and an n-type transistor Tn2b. The transistors Tn1b, Tp1b, and Tn2b are connected in series between the power supply Vdd and the ground GND in this order.

A drain of the transistor Tn1b is connected to the power supply Vdd, and a source thereof is connected to a source of the transistor Tp1b. The transistor Tn1b functions as an LDO linear regulator similarly to the transistor Tn1a.

As described above, the gate of the transistor Tp1b as the second transistor is commonly connected to the other ends of the input capacitive elements Crmpb and Cvslb. A source of the transistor Tp1b is connected to a source of the transistor Tn1b, and a drain of the transistor Tp1b is connected to the output terminal and a drain of the transistor Tn2b. When an addition signal of the pixel signal VSL from the capacitor unit 120b and the reference signal RAMP from the DAC 104 exceeds the reference voltage, the transistor Tp1b is changed from the conductive state to the non-conductive state, and inverts a level of the output signal OUTb. That is, the transistor Tp1b functions as the amplifier that amplifies and detects the level of the pixel signal VSL.

The transistor Tn2b functions as a constant current source for causing a constant current to flow through the transistor Tp1b.

An AZ switch SW1b is connected between the gate of the transistor Tp1b and an output terminal Toutb, and performs the auto-zero operation by equalizing a potential between the gate of the transistor Tp1a and the output terminal Toutb before the pixel signal VSL is detected.

With such a configuration, the comparator 121b outputs the output signal OUTb as the second output signal from an output unit between the transistors Tp1b and Tn2b.

Note that the current sources CS1a and CS1b are connected to the vertical signal line 110, and are configured to cause a constant current to flow through the vertical signal line 110.

The configuration of the comparator 121b is the same as the configuration of the comparator 121a. That is, the transistors Tn1a and Tn1b have the same configuration, the transistors Tp1a and Tp1b have the same configuration, and the transistors Tn2a and Tn2b have the same configuration. As a result, the gains Ga and Gb of the ADC groups 105a and 105b are substantially determined by a difference between the capacitance ratio of the input capacitive element Cvsla to the input capacitive element Crmpa and the capacitance ratio of the input capacitive element Cvslb to the input capacitive element Crmpb. Therefore, the ADC group 105a outputs the comparison result between the pixel signal VSL and the reference signal RAMP as the output signal OUTa with low gain. The ADC group 105b outputs the comparison result between the pixel signal VSL and the reference signal RAMP as the output signal OUTb with high gain. As a result, the solid-state imaging element 100 can detect irradiation light of a wide dynamic range (High Dynamic Range (HDR)) from low illuminance to high illuminance. Furthermore, by making the configurations of the comparators 121a and 121b the same, the comparators 121a and 121b can be simultaneously formed in the same process, and the manufacturing cost can be suppressed low.

Next, the operation of the solid-state imaging element 100 according to the present embodiment will be described.

Figure 6:
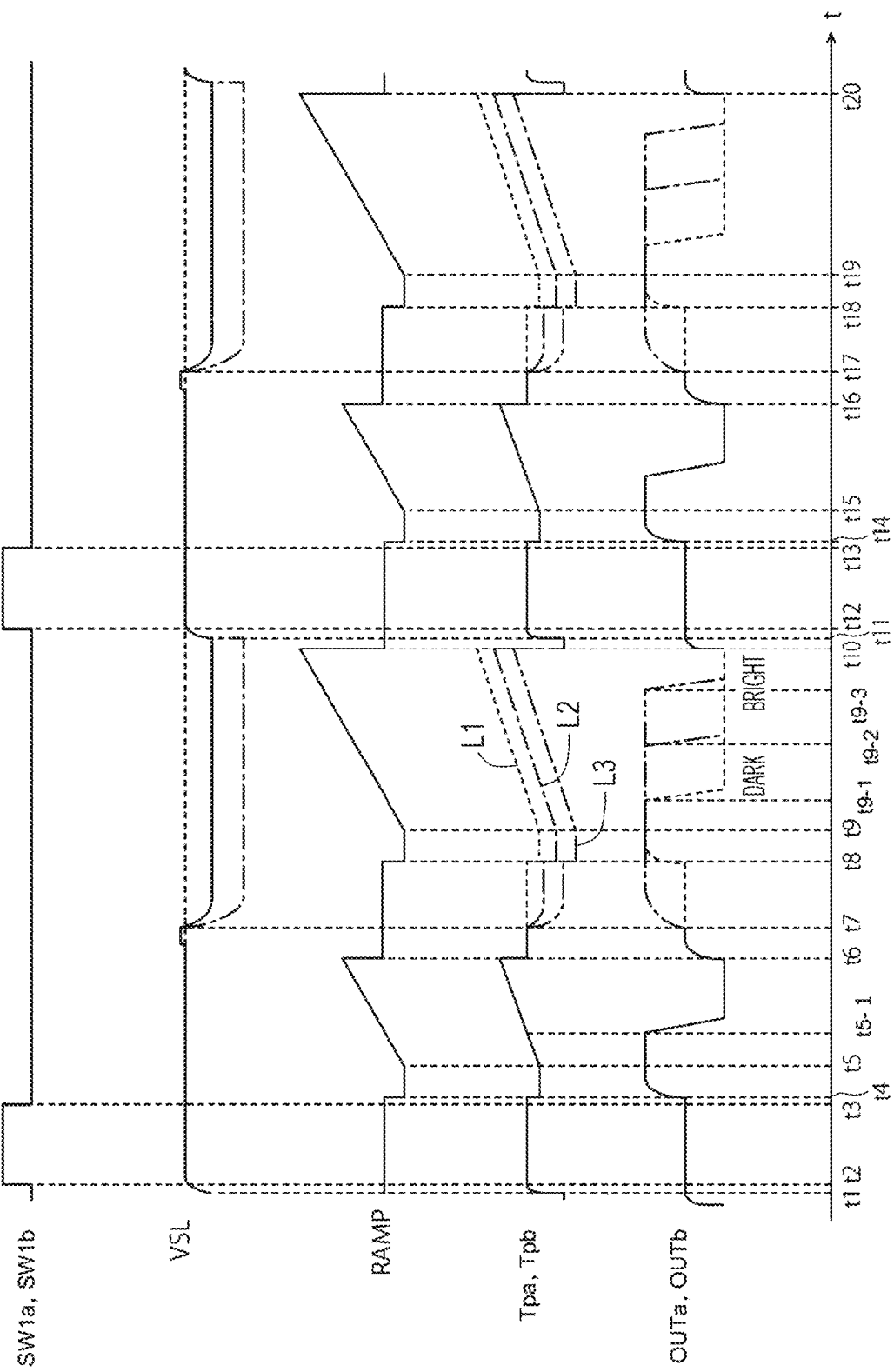
FIG. 6 is a timing diagram illustrating an example of operation of the solid-state imaging element according to the first embodiment.

FIG. 6 is a timing chart illustrating an example of the operation of the solid-state imaging element 100 according to the first embodiment. The horizontal axis represents time. The vertical axis represents the drive signals of the AZ switches SW1a and SW1b, the pixel signal VSL, the reference signal RAMP, the gate voltages of the transistors Tp1a and Tp1b, and voltage levels (signal levels) of the output signals OUTa and OUTb. Note that, it is assumed that the transistors Tn1a and Tn1b are always on during signal detection. Furthermore, it is assumed that the transistors Tn2a and Tn2b cause a constant current to flow in the transistors Tp1a and Tp1b.

At time t1, the FD 153 of the pixel 150 to be read is reset, and the pixel signal VSL is set to the reset level. At this time, the reference signal RAMP is set to a predetermined reset level.

At time t2, the drive signals of the AZ switches SW1a and SW1b are set to a high level, and the auto-zero operations of the comparators 121a and 121b are performed. Specifically, the AZ switch SW1a is turned on, the gate of the transistor Tp1a and the output unit Touta are connected, and the input and output of the comparator 121a are short-circuited. As a result, the gate voltage of the transistor Tp1a and the voltage of the output signal OUTa converge to a voltage close to the middle between a high level and a low level of the output signal OUTa. The converged voltage becomes a reference voltage of the comparator 121a. Thus, after that, when the AZ switch SW1a is turned off, when the gate voltage of the transistor Tp1a (input voltage of the comparator 121a) rises above the reference voltage, the voltage of the output signal OUTa decreases and goes to the low level. On the other hand, when the gate voltage of the transistor Tp1a (input voltage of the comparator 121a) falls below the reference voltage, the voltage of the output signal OUTa increases and goes to the high level.

Similarly to the AZ switch SW1a, the AZ switch SW1b also performs the auto-zero operation on the comparator 121b. That is, the AZ switch SW1b is turned on, the gate of the transistor Tp1b and the output unit Toutb are connected, and the input and output of the comparator 121b are short-circuited. As a result, the gate voltage of the transistor Tp1b and the voltage of the output signal OUTb converge to a voltage close to the middle between a high level and a low level of the output signal OUTb. The converged voltage becomes a reference voltage of the comparator 121b. Thus, after that, when the AZ switch SW1b is turned off, when the gate voltage of the transistor Tp1b (input voltage of the comparator 121b) rises above the reference voltage, the voltage of the output signal OUTb decreases and goes to the low level. On the other hand, when the gate voltage of the transistor Tp1b (input voltage of the comparator 121b) falls below the reference voltage, the voltage of the output signal OUTb increases and goes to the high level.

At time t3, the drive signals of the AZ switches SW1a and SW1b are set to the low level, the AZ switches SW1a and SW1b are turned off, and the auto-zero operation of the comparators 121a and 121b ends. The voltages of the transistors Tp1a and Tp1b and the voltages of the output signals OUTa and OUTb are maintained at the reference voltages. Since the configurations of the comparators 121a and 121b are the same, the reference voltages of the comparators 121a and 121b are substantially the same.

At time t4, the voltage of the reference signal RAMP decreases from the reset level by a predetermined value. As a result, the gate voltages of the transistors Tp1a and Tp1b fall below the reference voltage, and the output signals OUTa and OUTb become the high level.

At time t5, the voltage level of the reference signal RAMP linearly increases. Accordingly, the gate voltages of the transistors Tp1a and Tp1b also linearly increase. Furthermore, the counter 122 in FIG. 1 starts counting.

At time point t5-1, when the gate voltages of the transistors Tp1a and Tp1b exceed the reference voltage, the voltages of the output signals OUTa and OUTb are inverted to the low level. The count value of the counter 122 when the output signals OUTa and OUTb are inverted to the low level is held as a value of a P-phase (reset level) of the pixel signal VSL in the latch circuit 123 of FIG. 1. The latch circuit 123 latches both the output signals OUTa and OUTb.

At time t6, the voltage of the reference signal RAMP is set again to the reset voltage. As a result, the gate voltages of the transistors Tp1a and Tp1b return to the reference voltage, and the output signals OUTa and OUTb become substantially equal to the reference voltage.

At time t7, the transfer transistor 152 of the pixel 150 is turned on, and the charge accumulated in the photodiode 151 during the exposure period is transferred to the FD 153. As a result, the pixel signal VSL becomes the signal level, and the gate voltages of the transistors Tp1a and Tp1b are lowered from the reference voltage by a value corresponding to the signal level. As a result, the output signals OUTa and OUTb go to the high level. However, in a case where the signal level of the pixel signal VSL is small, the output signals OUTa and OUTb are held at values substantially close to the reference voltage.

At time t8, similarly to time t4, the voltage of the reference signal RAMP is lowered from the reset level by a predetermined value. As a result, the gate voltages of the transistors Tp1a and Tp1b further decrease from the signal level.

At time t9, similarly to time t5, the voltage level of the reference signal RAMP linearly increases. Accordingly, the gate voltages of the transistors Tp1a and Tp1b also linearly increase. Furthermore, the counter 122 starts counting.

From time t9-1 to time t9-3, when the gate voltages of the transistors Tp1a and Tp1b exceed the reference voltage, the output signals OUTa and OUTb are inverted to the low level. For example, in a case where the illuminance of the irradiation light is low and the pixel signal VSL is small, the levels of the gate voltages of the transistors Tp1a and Tp1b do not decrease so much in the pixel signal VSL as indicated by a line L1. In this case, at relatively early time t9-1, the gate voltages of the transistors Tp1a and Tp1b exceed the reference voltage, and the output signals OUTa and OUTb are inverted to the low level. In a case where the illuminance of the irradiation light is medium and the pixel signal VSL is medium, as indicated by a line L2, at t9-2, the gate voltages of the transistors Tp1a and Tp1b exceed the reference voltage, and the output signals OUTa and OUTb are inverted to the low level. In a case where the illuminance of the irradiation light is high and the pixel signal VSL is high, as indicated by a line L3, at relatively late time t9-3, the gate voltages of the transistors Tp1a and Tp1b exceed the reference voltage, and the output signals OUTa and OUTb are inverted to the low level. As described above, a period from the start of the increase in the reference signal RAMP to the inversion of the output signals OUTa and OUTb varies depending on the illuminance of the irradiation light.

The count value of the counter 122 when the output signals OUTa and OUTb are inverted to the low level is held as a value of a D-phase (signal level) of the pixel signal VSL in the latch circuit 123 of FIG. 1. The latch circuit 123 latches both the output signals OUTa and OUTb. The latch circuit 123 performs CDS by taking a difference between the D-phase pixel signal VSL and the P-phase pixel signal VSL read between time t5 and time t6. In this manner, AD conversion of the pixel signal VSL is performed. The AD conversion is executed in each of the ADC groups 105a and 105b, and is executed for the pixel signals VSL detected with different input capacitance gains. Digital image data from the ADC group 105a and digital image data from the ADC group 105b are transmitted to the signal processing circuit 108.

Since the period from the start of the increase in the reference signal RAMP to the inversion of the output signals OUTa and OUTb varies depending on the illuminance of the irradiation light, the digital image data from the ADC groups 105a and 105b also has a value based on the illuminance of the irradiation light.

Thereafter, the signal processing circuit 108 selects or generates the pixel signal by using either or both of the output signals OUTa and OUTb, and generates image data. At this time, the signal processing circuit 108 may select the output signals OUTa and OUTb according to the illuminance of the irradiation light.

At time t10, similarly to time t6, the voltage of the reference signal RAMP is set to the reset voltage. As a result, the gate voltages of the transistors Tp1a and Tp1b return to the reference voltage, and the output signal OUT1 becomes substantially equal to the reference voltage. Thereafter, after time t11, operations similar to those at times t1 to t10 are repeated.

According to the present embodiment, in the solid-state imaging element 100, the ADC group corresponding to each pixel column is divided into the plurality of ADC groups 105a and 105b having different gains. The gains of the ADC groups 105a and 105b are set by the input capacitance gains Ga and Gb of the capacitor units 120a and 120b, respectively. As a result, the signal processing circuit 108 can select or generate the pixel signal using either or both of the output signals OUTa and OUTb generated by detecting the pixel signal with a plurality of gains, and generate image data. At this time, the signal processing circuit 108 may select the output signals OUTa and OUTb according to the illuminance (light intensity) of the irradiation light. For example, in a case where the illuminance of the irradiation light is relatively high, the signal processing circuit 108 selects the output signal OUTa detected with a low gain by the ADC group 105a and generates image data. In a case where the illuminance of the irradiation light is relatively low, the signal processing circuit 108 selects the output signal OUTb detected with a high gain by the ADC group 105b and generates image data. As a result, the solid-state imaging element 100 can perform imaging with high sensitivity (fine gradation) even with the low-illuminance irradiation light, and can perform imaging in a short time (with low power consumption) without saturation even with the high-illuminance irradiation light. That is, the solid-state imaging element 100 according to the present embodiment can perform imaging in a wide dynamic range (HDR) according to the illuminance of the irradiation light.

Furthermore, in the solid-state imaging element 100 according to the present embodiment, as illustrated in FIG. 2, the ADC group corresponding to each pixel column is divided into the plurality of ADC groups 105a and 105b and connected in parallel. The ADC groups 105a and 105b are provided on both sides of the logic circuit 516 and the peripheral circuit 517, and are spaced apart from each other. In a case where a plurality of ADCs having different gains is adjacent to each other, the output signals from the plurality of ADCs may affect each other due to a proximity effect. On the other hand, since the ADC groups 105a and 105b according to the present embodiment are spaced apart from each other, it is possible to suppress mutual influence even if the ADC groups have different gains. This allows the solid-state imaging element 100 to generate accurate image data.

Figure 7:
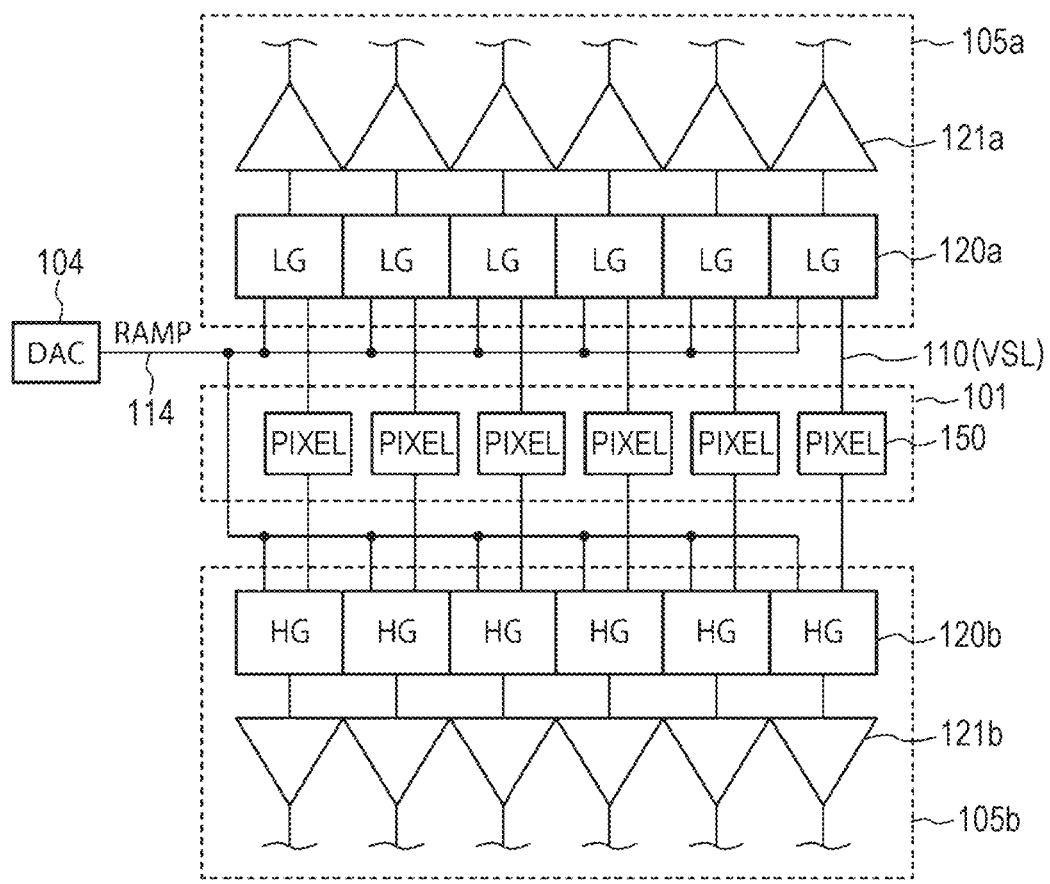
FIG. 7 is a block diagram illustrating an example of the configuration of the pixel unit and the ADC group.

According to the present embodiment, the gains of the ADC groups 105a and 105b are set by the capacitance ratio between the input capacitive elements Crmpa and Cvsla of the capacitor unit 120a and the capacitance ratio between the input capacitive elements Crmpb and Cvslb of the capacitor unit 120b, respectively. Therefore, the pixel signal VSL and the reference signal RAMP may be the same as or common to the ADC groups 105a and 105b. For example, as illustrated in FIG. 7, the DAC 104 is provided in common to the ADC groups 105a and 105b, and is only required to supply the same reference signal RAMP to the ADC groups 105a and 105b via the reference signal line 114. Even if the plurality of ADC groups 105a and 105b is provided, since the DAC 104 can be made common, the entire size of the solid-state imaging element 100 can be suppressed to be small. Of course, if it is not necessary to consider the size of the solid-state imaging element 100, the DAC 104 may be provided corresponding to each of the plurality of ADC groups 105a and 105b.

Furthermore, in the present embodiment, the comparators 121a and 121b are configured by single-type amplifiers. Therefore, as compared with the case of using a differential amplifier as in the second embodiment, the solid-state imaging element 100 according to the first embodiment can substantially halve current consumption and reduce power consumption.

In addition, the input voltages of the comparators 121a and 121b become an addition signal of the pixel signal VSL and the reference signal RAMP. In a case where the pixel signal VSL and the reference signal RAMP have opposite polarities, the input voltages of the comparators 121a and 121b become a differential voltage between the pixel signal VSL and the reference signal RAMP, and the amplitude becomes small. As a result, a voltage fluctuation of the comparators 121a and 121b can be reduced, and the voltage of the power supply Vdd can be lowered. As a result, the power consumption of the solid-state imaging element 100 can be reduced.

Second Embodiment

Figure 8A:
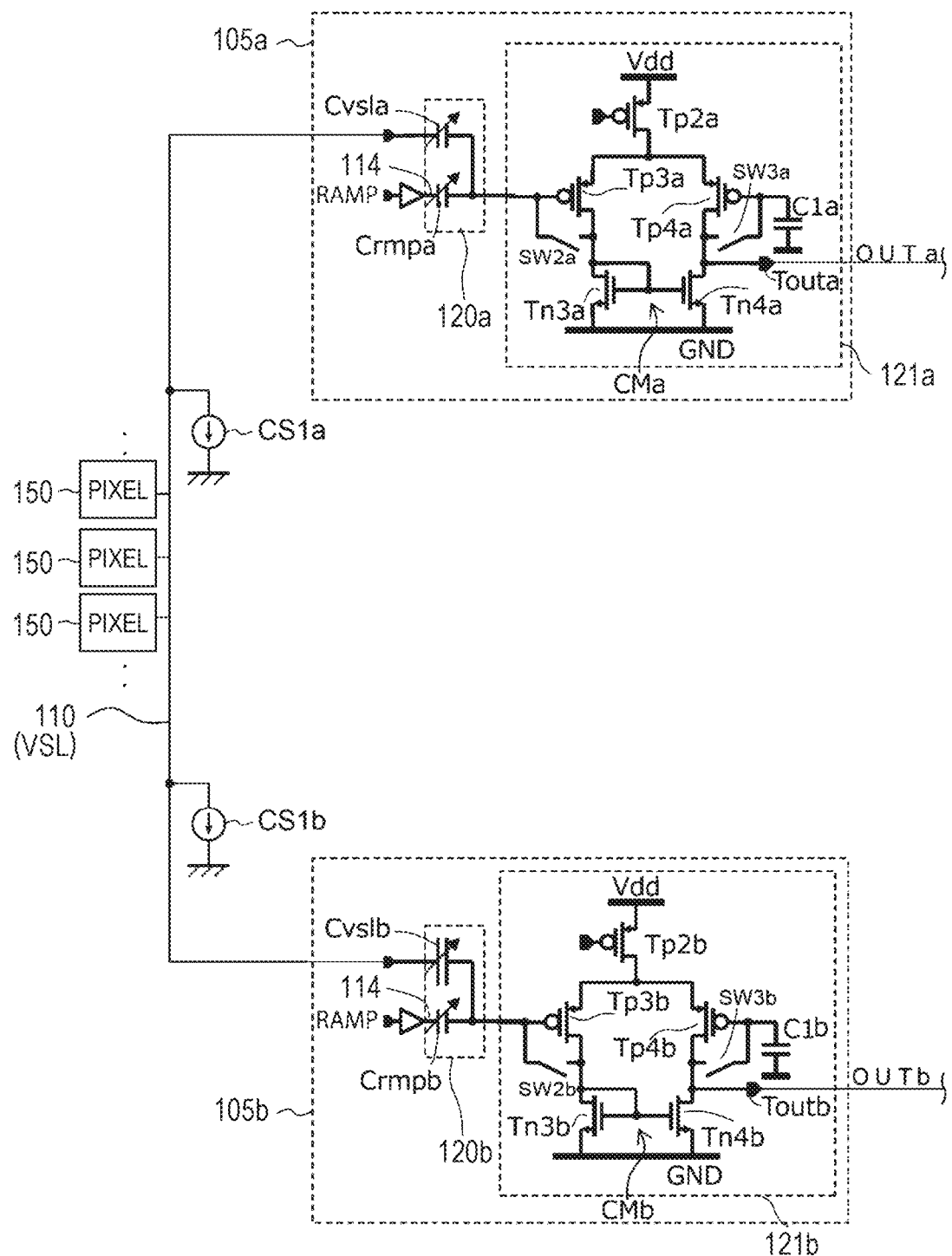
FIG. 8A is a diagram illustrating a configuration example of a solid-state imaging element according to a second embodiment.

FIG. 8A is a diagram illustrating a configuration example of a solid-state imaging element 100 according to the second embodiment. The second embodiment is different from the first embodiment in configurations of comparators 121a and 121b. Other configurations including capacitor units 120a and 120b may be similar to the corresponding configurations of the first embodiment.

The comparator 121a is a differential circuit that is connected to the capacitor unit 120a and outputs an output signal OUTa corresponding to a pixel signal VSL on the basis of a voltage difference between the pixel signal VSL and a reference signal RAMP.

The comparator 121a includes p-type transistors Tp2a to Tp4a, a current mirror circuit CMa, AZ switches SW2a and SW3a, and a capacitive element C1a.

A source of the transistor Tp2a is connected to a power supply Vdd, and a drain thereof is commonly connected to sources of the transistors Tp3a and Tp4a.

A gate of the transistor Tp3a as the first transistor is commonly connected to the other ends of input capacitive elements Crmpa and Cvsla. A source of the transistor Tp3a is connected to the drain of the transistor Tp2a, and a drain of the transistor Tp3a is connected to the current mirror circuit CMa.

A gate of the transistor Tp4a as the third transistor is connected to a ground GND via the capacitive element C1a. A source of the transistor Tp4a is connected to the drain of the transistor Tp2a in common with the source of the transistor Tp3a. A drain of the transistor Tp4a is connected to the current mirror circuit CMa and an output unit Touta.

The current mirror circuit CMa as the first mirror circuit is connected between the drains of the transistors Tp3a and Tp4a and the ground GND, and is configured to cause a substantially equal current to flow through the transistors Tp3a and Tp4a. More specifically, the current mirror circuit CMa includes an n-type transistor Tn3a connected between the transistor Tp3a and the ground GND, and an n-type transistor Tn4a connected between the transistor Tp4a and the ground GND. The gates of the transistors Tn3a and Tn4a are commonly connected to a drain of the transistor Tn3a.

The AZ switch SW2a is connected between the gate and drain of the transistor Tp3a, and performs the auto-zero operation by equalizing a potential between the gate and drain of the transistor Tp3a before the pixel signal VSL is detected.

The AZ switch SW3a is connected between the gate and drain of the transistor Tp4a, and performs the auto-zero operation by equalizing a potential between the gate and drain of the transistor Tp4a before the pixel signal VSL is detected.

When the voltage level of an addition signal of the pixel signal VSL and the reference signal RAMP exceeds a reference voltage, the transistor Tp3a is changed from the conductive state to the non-conductive state. The current mirror circuit CMa causes a current obtained by multiplying the current flowing through the transistor Tp3a by a predetermined mirror ratio to flow through the transistor Tp4a.

The transistor Tp4a generates the voltage level of the output signal OUTa according to the current flowing through the transistor Tp3a. When the transistor Tp3a is changed from the conductive state to the non-conductive state, the transistor Tp4a causes a predetermined current to flow similarly to the transistor Tn3a, so that the output signal OUTa is inverted from the low level to the high level. That is, similarly to the first embodiment, the comparator 121a inverts the level of the output signal OUTa when the voltage level of the addition signal of the pixel signal VSL and the reference signal RAMP exceeds the reference voltage.

The comparator 121b is a differential circuit that is connected to the capacitor unit 120b and outputs the output signal OUTb corresponding to the pixel signal VSL on the basis of the voltage difference between the pixel signal VSL and the reference signal RAMP.

The comparator 121b includes p-type transistors Tp2b to Tp4b, a current mirror circuit CMb, AZ switches SW1b and SW2b, and a capacitive element C1b.

A source of the transistor Tp2b is connected to the power supply Vdd, and a drain thereof is commonly connected to sources of the transistors Tp3b and Tp4b.

A gate of the transistor Tp3b as the second transistor is commonly connected to the other ends of the input capacitive elements Crmpb and Cvslb. A source of the transistor Tp3b is connected to the drain of the transistor Tp2b, and a drain of the transistor Tp3b is connected to the current mirror circuit CMb.

A gate of the transistor Tp4b as the fourth transistor is connected to the ground GND via the capacitive element C1b. A source of the transistor Tp4b is connected to the drain of the transistor Tp2b in common with the source of the transistor Tp3b. A drain of the transistor Tp4b is connected to the current mirror circuit CMb and the output unit Toutb.

The current mirror circuit CMb as the second mirror circuit is connected between the drains of the transistors Tp3b and Tp4b and the ground GND, and is configured to cause a substantially equal current to flow through the transistors Tp3b and Tp4b. More specifically, the current mirror circuit CMb includes an n-type transistor Tn3b connected between the transistor Tp3b and the ground GND, and an n-type transistor Tn4b connected between the transistor Tp4b and the ground GND. The gates of the transistors Tn3b and Tn4b are commonly connected to a drain of the transistor Tn3b.

The AZ switch SW2b is connected between the gate and drain of the transistor Tp3b, and performs the auto-zero operation by equalizing a potential between the gate and drain of the transistor Tp3b before the pixel signal VSL is detected.

The AZ switch SW3b is connected between the gate and drain of the transistor Tp4b, and performs the auto-zero operation by equalizing a potential between the gate and drain of the transistor Tp4b before the pixel signal VSL is detected.

When the voltage level of the addition signal of the pixel signal VSL and the reference signal RAMP exceeds the reference voltage, the transistor Tp3b is changed from the conductive state to the non-conductive state. The current mirror circuit CMb causes a current obtained by multiplying the current flowing through the transistor Tp3b by a predetermined mirror ratio to flow through the transistor Tp4b. The transistor Tp4b generates the voltage level of the output signal OUTb according to the current flowing through the transistor Tp3b. As a result, the transistor Tp3b is changed from the conductive state to the non-conductive state, the transistor Tp4b causes a predetermined current to flow similarly to the transistor Tn3b, so that the output signal OUTb is inverted from the low level to the high level. That is, similarly to the first embodiment, the comparator 121b inverts the level of the output signal OUTb when the voltage level of the addition signal of the pixel signal VSL and the reference signal RAMP exceeds the reference voltage.

Other configurations and operations of the second embodiment may be the same as the corresponding configurations and operations of the first embodiment. Therefore, although the second embodiment consumes more power than the first embodiment, the other effects of the first embodiment can be obtained.

Modification

Figure 8B:
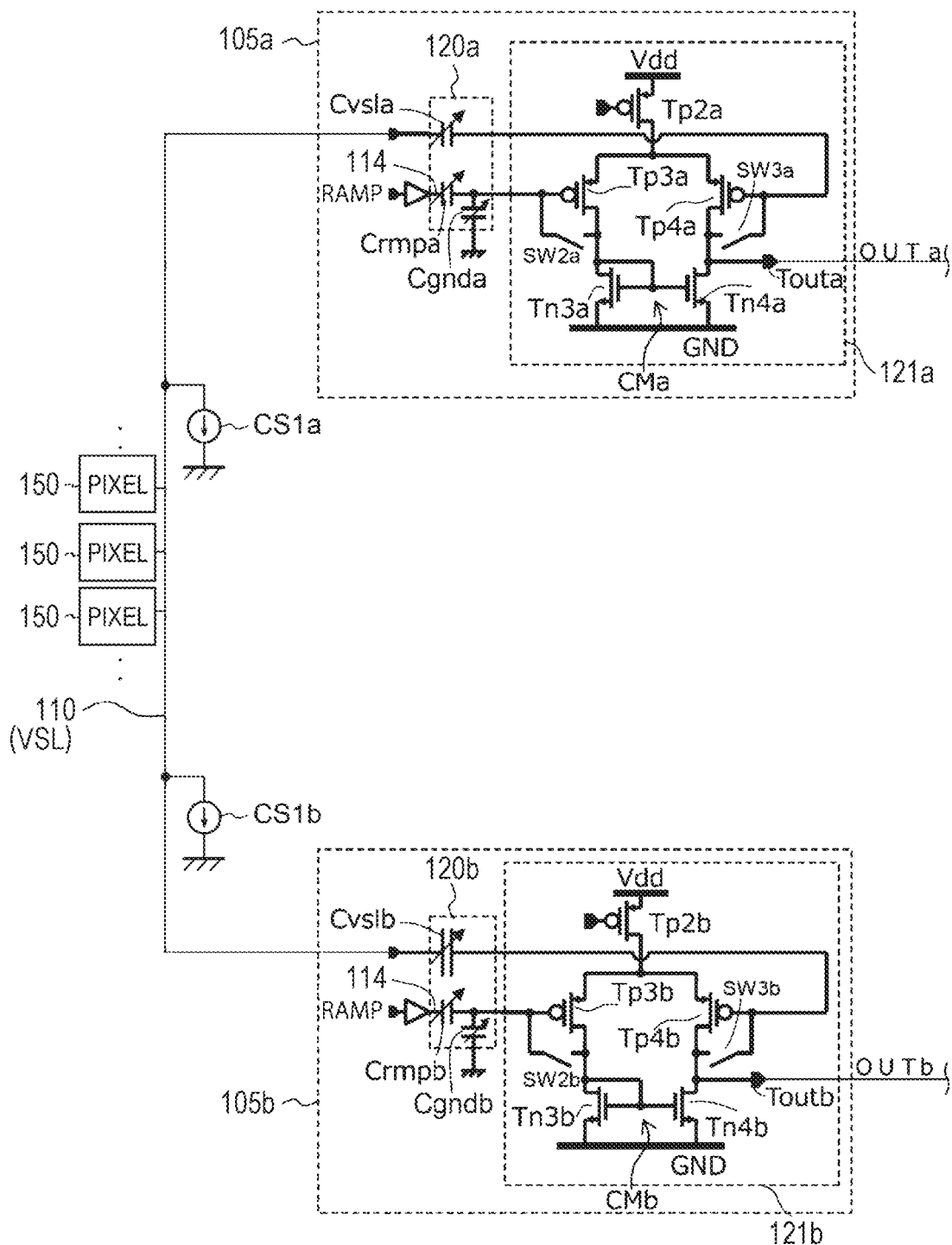
FIG. 8B is a diagram illustrating a configuration example of the solid-state imaging element according to a modification of the second embodiment.

FIG. 8B is a diagram illustrating a configuration example of the solid-state imaging element 100 according to a modification of the second embodiment. In the present modification, the comparators 121a and 121b function as a differential circuit between the pixel signal VSL and the reference signal RAMP. The other end of the input capacitive element Cvsla is not connected to the gate of the transistor Tp3a, but is connected to the gate of the transistor Tp4a. The other end of the input capacitive element Cvslb is not connected to the gate of the transistor Tp3b, but is connected to the gate of the transistor Tp4b.

Input capacitive elements Cgnda and Cgndb are connected between the gates of the transistors Tp3a and Tp3b and the ground GND, respectively. The input capacitive elements Cgnda and Cgndb are variable capacitive elements. A variable capacitive element similar to the input capacitive elements Crmpa and Crmp may be used. In the present modification, the input capacitive element gains Ga and Gb are set by making the capacitances of the input capacitive elements Cgnda and Cgndb different from each other.

The comparator 121a amplifies the difference between the pixel signal VSL and the reference signal RAMP and outputs the amplified difference as the output signal OUTa. The comparator 121b amplifies the difference between the pixel signal VSL and the reference signal RAMP and outputs the amplified difference as the output signal OUTb. At this time, the input capacitance gain Ga of the capacitor unit 120a is determined by a capacitance ratio of the input capacitive elements Crmpa and Cgnda. The input capacitance gain Gb of the capacitor unit 120b is determined by a capacitance ratio of the input capacitive elements Crmpb and Cgndb.

The operation of the present modification may be the same as the operation of the second embodiment. Therefore, the modification can obtain the same effects as those of the second embodiment.

Modification

Figure 8C:
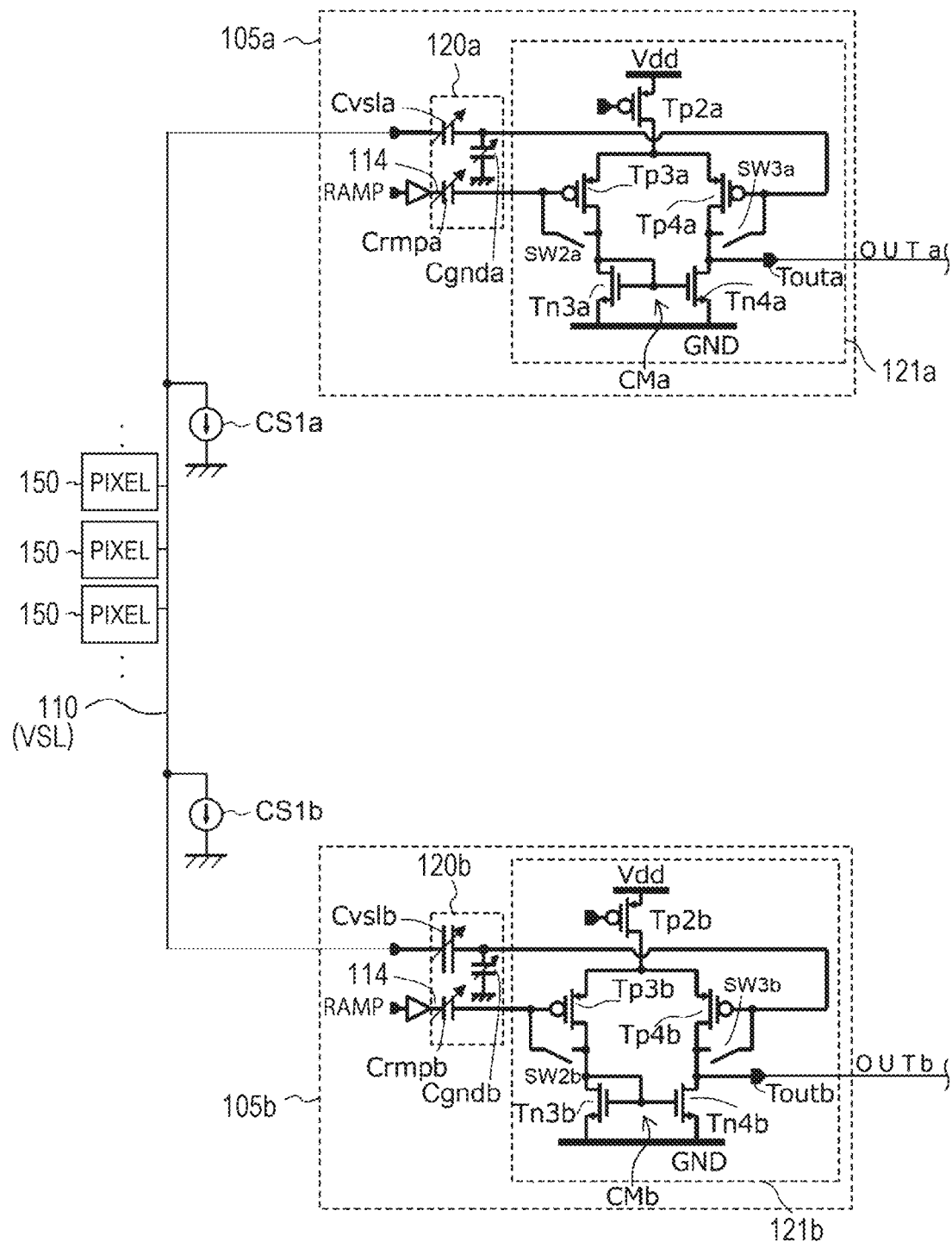
FIG. 8C is a diagram illustrating a configuration example of the solid-state imaging element according to another modification of the second embodiment.

FIG. 8C is a diagram illustrating a configuration example of the solid-state imaging element 100 according to another modification of the second embodiment. In the present modification, the input capacitive elements Cgnda and Cgndb are connected between the gates of the transistors Tp4a and Tp4b and the ground GND, respectively. Also in the present modification, the input capacitive element gains Ga and Gb are set by making the capacitances of the input capacitive elements Cgnda and Cgndb different from each other. The input capacitance gain Ga of the capacitor unit 120a is determined by a capacitance ratio of the input capacitive elements Cvsla and Cgnda. The input capacitance gain Gb of the capacitor unit 120b is determined by a capacitance ratio of the input capacitive elements Cvslb and Cgndb. Other configurations of the present modification may be similar to the configuration of the modification of FIG. 8B. The operation of the present modification may be the same as the operation of the second embodiment. Therefore, the modification can also obtain the same effects as those of the second embodiment.

Third Embodiment

Figure 9:
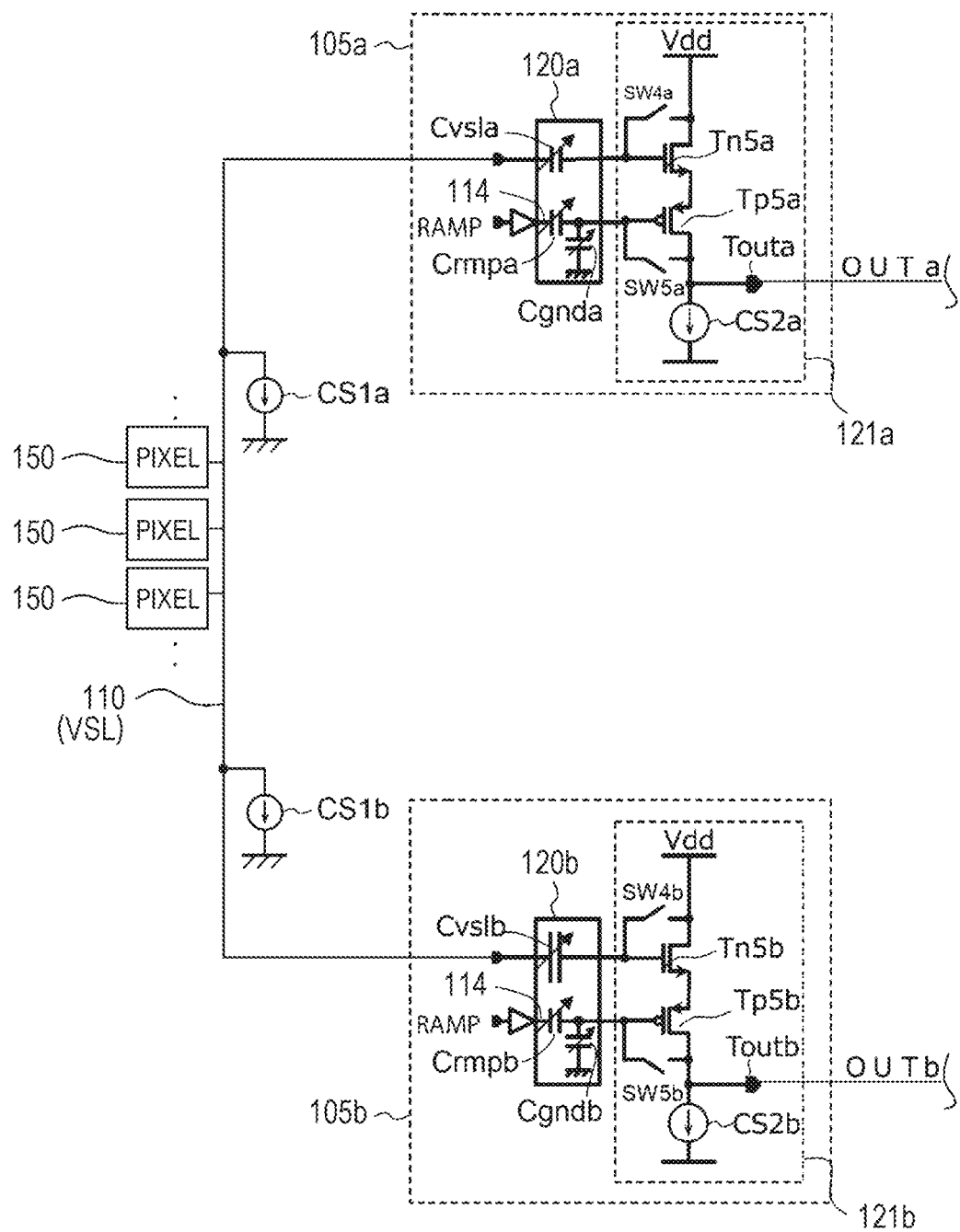
FIG. 9 is a diagram illustrating a configuration example of a solid-state imaging element according to a third embodiment.

FIG. 9 is a diagram illustrating a configuration example of a solid-state imaging element 100 according to a third embodiment. The third embodiment is different from the first embodiment in configurations of comparators 121a and 121b and a vertical signal line 110. Other configurations including capacitor units 120a and 120b may be similar to the corresponding configurations of the first embodiment.

In the third embodiment, a constant current source CS1a is connected to each of the vertical signal lines 110. When the pixel signal is detected, the constant current source CS1a causes a predetermined constant current to flow through the vertical signal line 110, and generates the pixel signal VSL in the vertical signal line 110.

The comparator 121a includes an n-type transistor Tn5a, a p-type transistor Tp5a, a constant current source CS2a, and AZ switches SW4a and SW5a.

A gate of the transistor Tn5a is connected to the other end of the input capacitive element Cvsla. A drain of the transistor Tn5a is connected to the power supply Vdd, and a source thereof is connected to a source of the transistor Tp5a. The transistor Tn5a generates a signal of the voltage level corresponding to the pixel signal VSL and transmits the signal to the source of the transistor Tp5a.

A gate of the transistor Tp5a as the first transistor is connected to the other end of the input capacitive element Crmpa. The source of the transistor Tp5a is connected to a source of the transistor Tn5a, and a drain thereof is connected to the constant current source CS2a and the output unit Touta. The transistor Tp5a is in a conductive state based on a voltage difference Vgs between the source voltage and the gate voltage.

For example, in the third embodiment, when the pixel signal VSL is detected, the voltage level of the reference signal RAMP is linearly decreased from a level higher than the pixel signal VSL. As a result, when the reference signal RAMP falls below the pixel signal VSL, the transistor Tp5a changes from the non-conductive state to the conductive state. The constant current source CS2a causes a constant current to flow through the transistors Tn5a and Tp5a. Therefore, when the transistor Tp5a is in the non-conductive state, the output signal OUTa is at the low level, and when the transistor Tp5a is in the conductive state, the output signal OUTa is at the high level. That is, when the reference signal RAMP falls below the pixel signal VSL, the output signal OUTa is inverted from the low level to the high level. As described above, in the third embodiment, the transistor Tp5a can generate the output signal OUTa obtained by amplifying a differential voltage between the pixel signal VSL and the reference signal RAMP.

The input capacitive elements Cgnda and Cgndb are connected between the gates of the transistors Tp5a and Tp5b and the ground GND, respectively. The input capacitive elements Cgnda and Cgndb are variable capacitive elements. A variable capacitive element similar to the input capacitive elements Crmpa and Crmp may be used. In the third embodiment, the input capacitive element gains Ga and Gb are set by making the capacitances of the input capacitive elements Cgnda and Cgndb different from each other.

The AZ switch SW4a is connected between the gate and drain of the transistor Tn5a, and performs the auto-zero operation by equalizing a potential between the gate and drain of the transistor Tn5a before the pixel signal VSL is detected.

The AZ switch SW5a is connected between the gate and drain of the transistor Tp5a, and performs the auto-zero operation by equalizing a potential between the gate and drain of the transistor Tp5a before the pixel signal VSL is detected.

The comparator 121b includes an n-type transistor Tn5b, a p-type transistor Tp5b, a constant current source CS2b, and AZ switches SW4b and SW5b.

A gate of the transistor Tn5b is connected to the other end of the input capacitive element Cvslb. A drain of the transistor Tn5b is connected to the power supply Vdd, and a source thereof is connected to a source of the transistor Tp5b. The transistor Tn5b generates a signal of the voltage level corresponding to the pixel signal VSL and transmits the signal to the source of the transistor Tp5b.

A gate of the transistor Tp5b as the second transistor is connected to the other end of the input capacitive element Crmpb. The source of the transistor Tp5b is connected to a source of the transistor Tn5b, and a drain thereof is connected to the constant current source CS2b and the output unit Toutb. The transistor Tp5b is in the conductive state based on the voltage difference Vgs between the source voltage and the gate voltage.

As a result, when the reference signal RAMP falls below the pixel signal VSL, the transistor Tp5b changes from the non-conductive state to the conductive state. The constant current source CS2b causes a constant current to flow through the transistors Tn5b and Tp5b. Therefore, when the transistor Tp5b is in the non-conductive state, the output signal OUTb is at the low level, and when the transistor Tp5b is in the conductive state, the output signal OUTb is at the high level. That is, when the reference signal RAMP falls below the pixel signal VSL, the output signal OUTb is inverted from the low level to the high level. As described above, the transistor Tp5b can generate the output signal OUTb obtained by amplifying the differential voltage between the pixel signal VSL and the reference signal RAMP.

The AZ switch SW4b is connected between the gate and drain of the transistor Tn5b, and performs the auto-zero operation by equalizing a potential between the gate and drain of the transistor Tn5b before the pixel signal VSL is detected.

The AZ switch SW5b is connected between the gate and drain of the transistor Tp5b, and performs the auto-zero operation by equalizing a potential between the gate and drain of the transistor Tp5b before the pixel signal VSL is detected.

Figure 10:
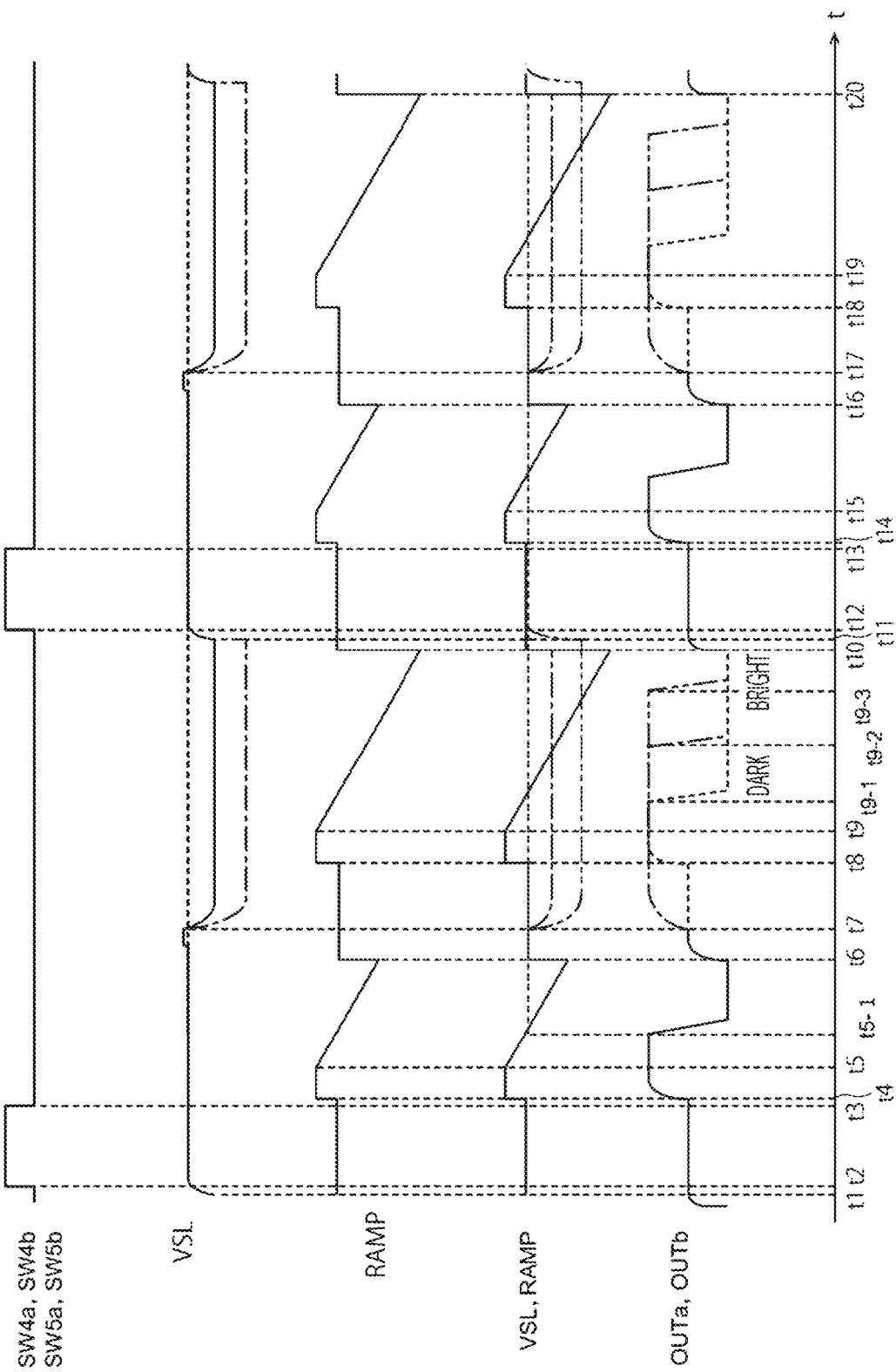
FIG. 10 is a timing diagram illustrating an example of operation of the solid-state imaging element according to the third embodiment.

FIG. 10 is a timing chart illustrating an example of the operation of the solid-state imaging element 100 according to the third embodiment. In the third embodiment, the reference signal RAMP decreases linearly from a level higher than the pixel signal VSL. That is, the reference signal RAMP may be obtained by inverting the polarity of the reference signal RAMP of the first embodiment. Therefore, the output signals OUTa and OUTb are inverted when the reference signal RAMP falls below the pixel signal VSL. Since other operations of the third embodiment may be similar to the corresponding operations of the first embodiment, detailed description thereof will be omitted. Note that the operations of the AZ switches SW4a, SW4b, SW5a, and SW5b may be the same as the operations of the AZ switches SW1a and SW1b of the first embodiment.

The third embodiment has capacitor units 120a and 102b similarly to the first embodiment, and can obtain the same effects as the first embodiment.

Fourth Embodiment

Figure 11:
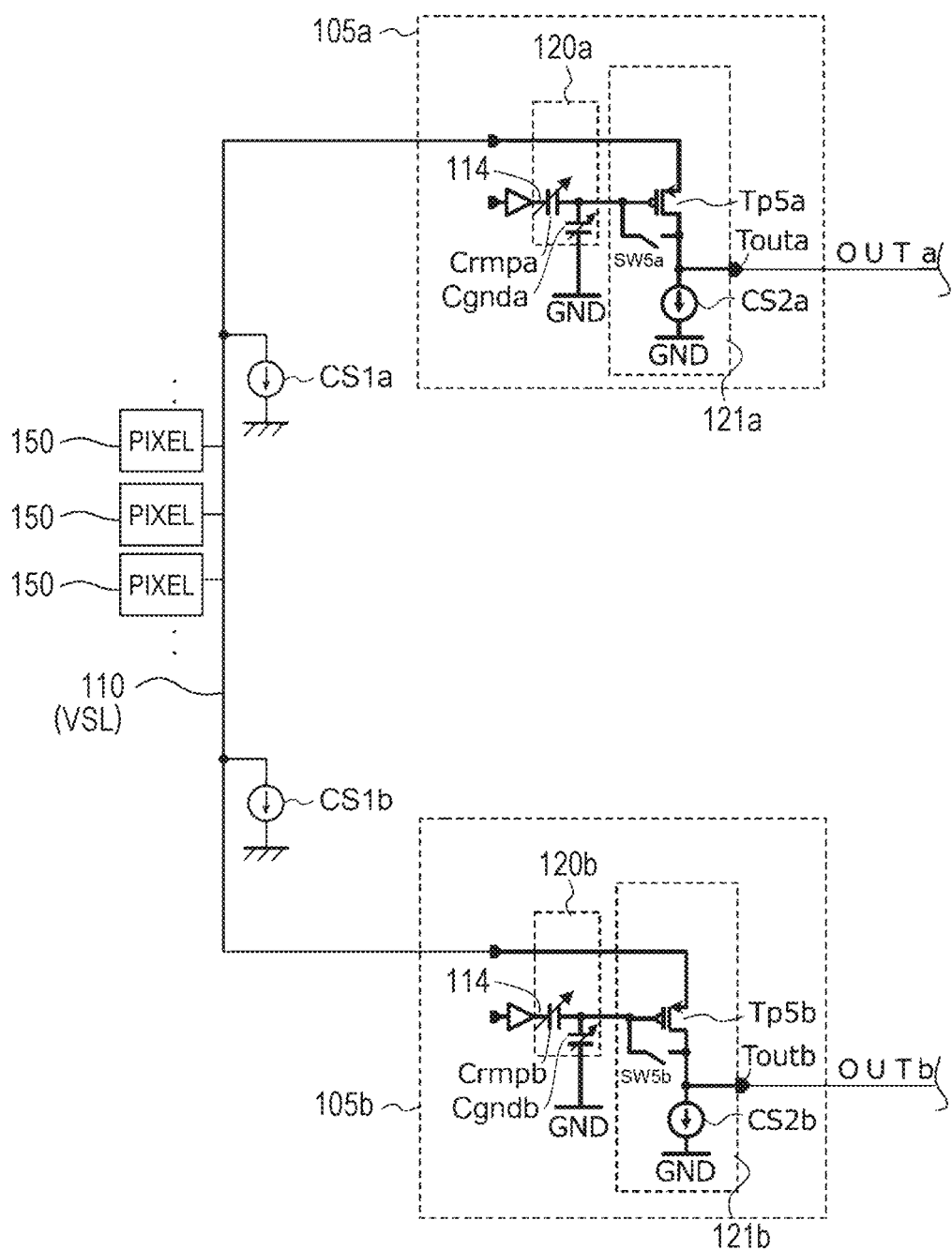
FIG. 11 is a diagram illustrating a configuration example of a solid-state imaging element according to a fourth embodiment.

FIG. 11 is a diagram illustrating a configuration example of a solid-state imaging element 100 according to a fourth embodiment. The fourth embodiment is different from the third embodiment in that the input capacitive elements Cvsla and Cvslb, the constant current source CS1a, the transistors Tn5a and Tn5b, and the AZ switches SW4a and SW4b are omitted, and input capacitive elements Cgnda and Cgndb are added. A gate of the transistor Tp5a is connected to one end of an input capacitive element Crmpa, and receives a reference signal RAMP via the input capacitive element Crmpa. Furthermore, the gate of the transistor Tp5a is connected to one end of the input capacitive element Cgnda, and is connected to a ground GND via the input capacitive element Cgnda. The source of the transistor Tp5a is connected to the vertical signal line 110 and receives the pixel signal VSL. A gate of the transistor Tp5b is connected to one end of an input capacitive element Crmpb, and receives the reference signal RAMP via the input capacitive element Crmpb. Furthermore, the gate of the transistor Tp5b is connected to one end of the input capacitive element Cgndb, and is connected to the ground GND via the input capacitive element Cgndb. The source of the transistor Tp5b is connected to the vertical signal line 110 and receives the pixel signal VSL. The transistors Tp5a and Tp5b receive the same reference signal RAMP at their gates via the input capacitive elements Crmpa and Crmpb. Furthermore, the transistors Tp5a and Tp5b receive the same pixel signal VSL from the vertical signal line 110.

One ends of the input capacitive elements Crmpa and Crmpb are commonly connected to a reference signal line 114, and the other ends are connected to the gates of the transistors Tp5a and Tp5b, respectively. The sources of the transistors Tp5a and Tp5b are commonly connected to the vertical signal line 110. One ends of the input capacitive elements Cgnda and Cgndb are connected to the gates of the transistors Tp5a and Tp5b, and the other ends are connected to the ground GND.

The input capacitive elements Cgnda and Cgndb may be variable capacitive elements similarly to the input capacitive elements Crmpa and Crmp. In the fourth embodiment, the input capacitive element gains Ga and Gb are set by making the capacitances of the input capacitive elements Cgnda and Cgndb different from each other. For example, the input capacitive gain Ga is determined by a capacitance ratio (for example, Cgnda/Cgnda+Crmpa) of the input capacitive element Cgnda to the input capacitive element Crmpa. The input capacitance gain Gb is determined by a capacitance ratio (for example, Cgndb/Cgndb+Crmpb) of the input capacitive element Cgndb to the input capacitive element Crmpb.

A current source that causes the current to flow through the vertical signal line 110 and a constant current that causes the current to flow through the comparators Tp5a and Tp5b are shared by the constant current sources CS2a and CS2b. Thus, the constant current sources CS2a and CS2b cause a constant current to flow through the vertical signal line 110, and cause a constant current to flow through the comparators Tp5a and Tp5b, respectively. As a result, the power consumption of the solid-state imaging element 100 according to the fourth embodiment is smaller than that according to the third embodiment.

In addition, the pixel signal VSL is input directly to the transistor Tp5a without passing through the transistor Tn5a in FIG. 9. The pixel signal VSL is input directly to the transistor Tp5b without passing through the transistor Tn5b in FIG. 9. In this manner, since the constant current source CS1a, the transistors Tn5a and Tn5b, and the AZ switches SW4a and SW4b are omitted, the layout area of the ADC groups 105a and 105b in the fourth embodiment is smaller than that in the third embodiment.

Other configurations of the fourth embodiment may be similar to the corresponding configurations of the third embodiment. Furthermore, the operation of the fourth embodiment may be similar to the operation of the third embodiment. Therefore, the fourth embodiment can also obtain the same effects as those of the third embodiment.

Modification 1

Figure 12:
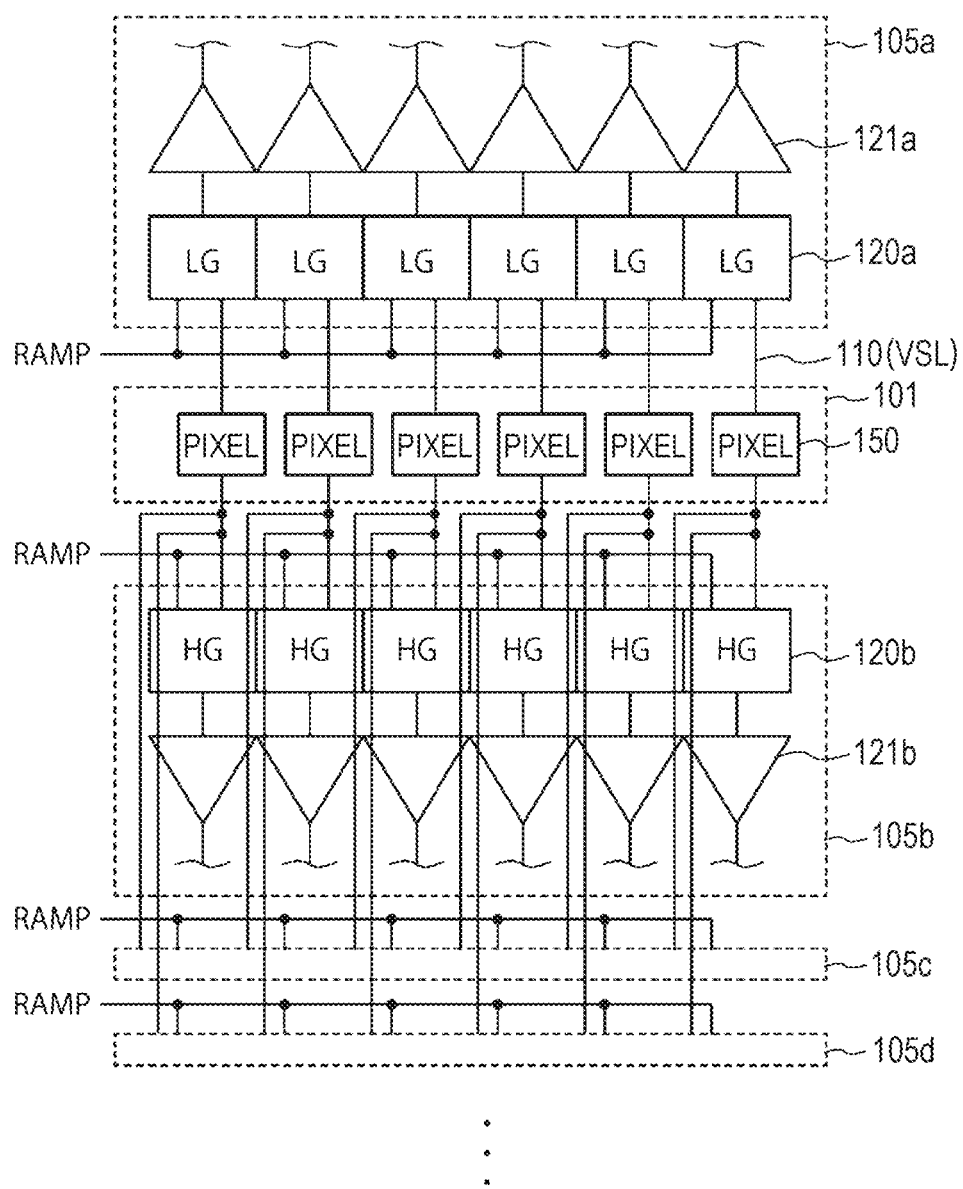
FIG. 12 is a diagram illustrating a configuration example of the solid-state imaging element according to Modification 1 of the first embodiment.

FIG. 12 is a diagram illustrating a configuration example of the solid-state imaging element 100 according to Modification 1 of the first embodiment. In the first embodiment, the two ADC groups 105a and 105b are connected in parallel to each pixel column. On the other hand, in Modification 1, three or more ADC groups 105a, 105b, 105c, . . . are connected in parallel to each pixel column. The ADC groups 105a, 105b, 105c . . . have the capacitor units 120a, 120b, 120c . . . of different input capacitance gains, respectively. As described above, in the solid-state imaging element 100, the three or more ADC groups 105a, 105b, 105c . . . may be provided corresponding to each pixel column. As a result, the dynamic range of detectable irradiation light can be further increased.

Modification 2

FIG. 13 is a table illustrating a relationship between the exposure time and the input capacitance gain of the solid-state imaging element 100 according to Modification 2. In the above embodiment, although the exposure time of the pixel unit 101 may be equal, the exposure time may be changed according to the illuminance of the irradiation light. The exposure time can be changed by the timing control circuit 102. For example, the solid-state imaging element 100 enables the exposure time of the pixel unit 101 to be selected between a relatively long first exposure time and a relatively short second exposure time. In this case, the ADC groups 105a and 105b detect the pixel signals VSL of the first and second exposure times with the input capacitance gains Ga and Gb, respectively. Therefore, a total of four types of first to fourth image data are obtained. That is, the first image data is image data obtained by detecting the pixel signal VSL obtained in the relatively long first exposure time with the relatively low input capacitance gain Ga. The second image data is image data obtained by detecting the pixel signal VSL obtained in the relatively short second exposure time with the relatively low input capacitance gain Ga. The third image data is image data obtained by detecting the pixel signal VSL obtained in the relatively long first exposure time with the relatively high input capacitance gain Gb. The fourth image data is image data obtained by detecting the pixel signal VSL obtained in the relatively short second exposure time with the relatively high input capacitance gain Gb.

The signal processing circuit 108 selects suitable image data from these four pieces of image data, or combines a plurality of pieces of image data among the four pieces of image data to generate one piece of image data. For example, in a case where the illuminance of the irradiation light is low (dark), the signal processing circuit 108 is only required to select the third image data having a long exposure time and a high gain. For example, in a case where the illuminance of the irradiation light is high (bright), the signal processing circuit 108 is only required to select the second image data having a short exposure time and a low gain.

As described above, in Modification 2, the dynamic range of the pixel signal detectable by the solid-state imaging element 100 is widened by the combination of the exposure time and the input capacitance gain.

Modification 3

FIG. 14 is a timing diagram illustrating an operation example of the solid-state imaging element 100 according to Modification 3. FIG. 15 is a table illustrating a combination of the reference signal and the input capacitance gain according to Modification 3.

In the above embodiment, although the voltage level of the reference signal RAMP linearly increases or decreases with an approximately equal slope, the slope of the reference signal RAMP may be switched. For example, FIG. 14 illustrates the reference signal RAMP of t9 to t10 of FIG. 10. A reference signal RAMPa decreases linearly with a relatively small slope, and a reference signal RAMPb decreases linearly with a relatively large slope.

The reference signals RAMPa and RAMPb are switched in the DAC 104. The low-illuminance irradiation light in which the voltage level of the pixel signal VSL is higher than a threshold is detected with high sensitivity by the reference signal RAMPa. On the other hand, the high-illuminance irradiation light in which the voltage level of the pixel signal VSL is lower than the threshold can be detected by the reference signal RAMPb in a relatively short time (with low power consumption).

As illustrated in FIG. 15, in Modification 3, the reference signals RAMPa and RAMPb are combined with the input capacitance gains Ga and Gb according to the present embodiment. That is, the ADC groups 105a and 105b detect the pixel signal VSL with the input capacitance gains Ga and Gb using the reference signal RAMPa or RAMPb. Accordingly, in Modification 3, similarly to the second modification, a total of four types of first to fourth image data are obtained. That is, the first image data is image data obtained by detecting the pixel signal VSL with the relatively low input capacitance gain Ga using the reference signal RAMPa. The second image data is image data obtained by detecting the pixel signal VSL with the relatively low input capacitance gain Ga using the reference signal RAMPb. The third image data is image data obtained by detecting the pixel signal VSL with the relatively high input capacitance gain Gb using the reference signal RAMPa. The fourth image data is image data obtained by detecting the pixel signal VSL with the relatively high input capacitance gain Gb using the reference signal RAMPb.

The signal processing circuit 108 selects suitable image data from these four pieces of image data, or combines a plurality of pieces of image data among the four pieces of image data to generate one piece of image data. For example, in a case where the illuminance of the irradiation light is low (dark), the signal processing circuit 108 is only required to select the third image data detected with the high gain Gb using the reference signal RAMPa having a small slope. For example, in a case where the illuminance of the irradiation light is high (bright), the signal processing circuit 108 is only required to select the second image data detected with a low gain ga using the reference signal RAMPb having a large slope.

As described above, in Modification 3, the dynamic range of the pixel signal detectable by the solid-state imaging element 100 is widened by the combination of the reference signal and the input capacitance gain.

Modifications 1 to 3 are applicable to any of the first to fifth embodiments. Furthermore, Modifications 1 to 3 may be combined with each other. For example, by combining Modifications 2 and 3, the dynamic range of the pixel signal detectable by the solid-state imaging element 100 can be further widened by the combination of the exposure time, the reference signal, and the input capacitance gain.

Fifth Embodiment

Figure 16:
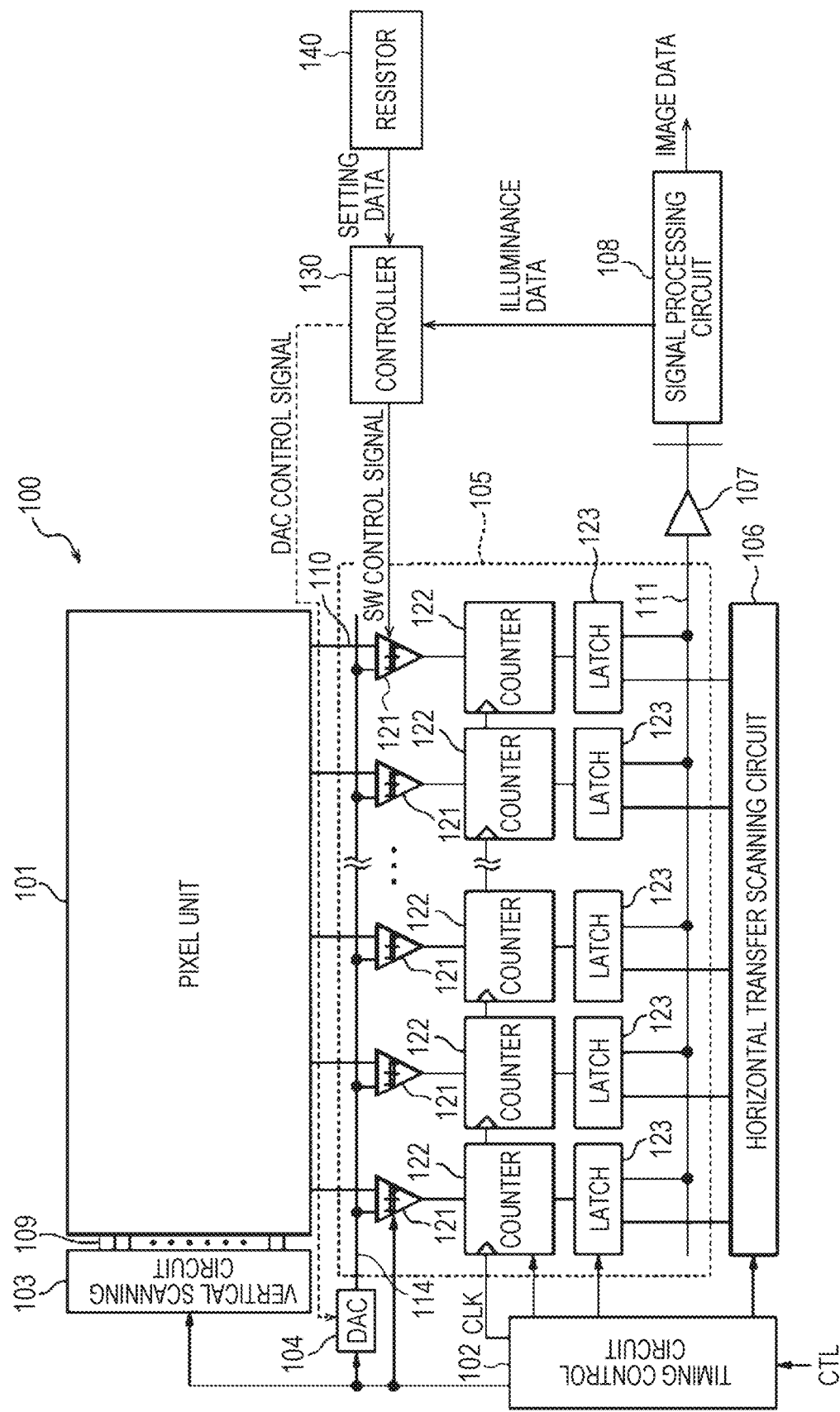
FIG. 16 is a block diagram illustrating a configuration example of a solid-state imaging element according to a fifth embodiment.
Figure 17:
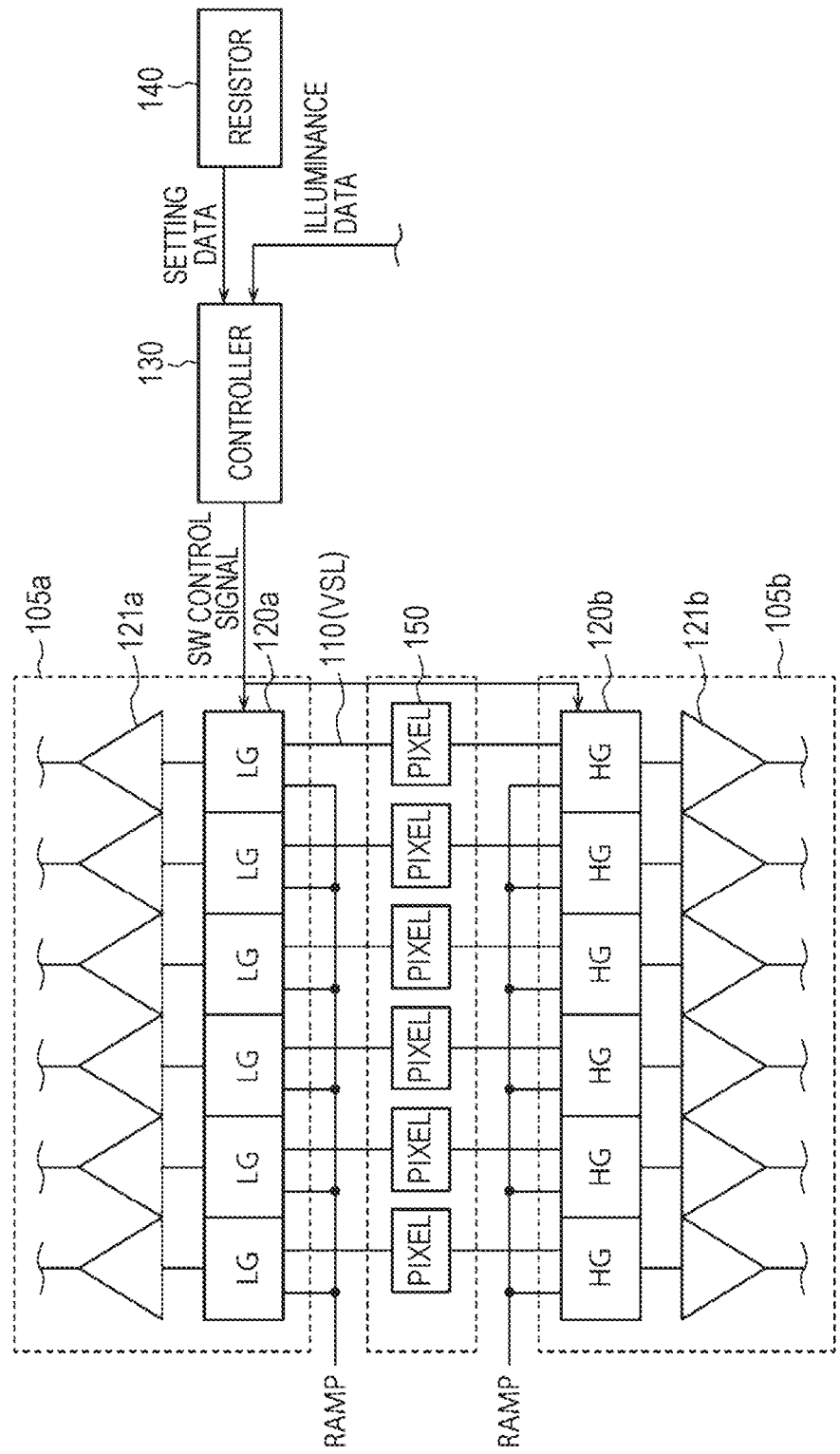
FIG. 17 is a block diagram illustrating a configuration example of an ADC group according to the fifth embodiment.

FIG. 16 is a block diagram illustrating a configuration example of a solid-state imaging element 100 according to the fifth embodiment. FIG. 17 is a block diagram illustrating a configuration example of ADC groups 105a and 105b according to the fifth embodiment. The solid-state imaging element 100 according to the fifth embodiment switches or controls the gains of the ADC groups 105a and 105b according to the illuminance of the irradiation light. For this purpose, the solid-state imaging element 100 further includes a controller 130 and a register 140.

Before imaging, a signal processing circuit 108 detects the illuminance of incident light with which a pixel unit 101 is irradiated on the basis of the pixel signal supplied from an amplifier circuit 107. The signal processing circuit 108 acquires the illuminance by using all or some pixel signals of the pixel unit 101. Since the illuminance does not require resolution as high as that of the image data, it is not necessary to perform CDS, and the slope of the reference signal RAMP may be steep. Therefore, the illuminance can be detected in a short time. The signal processing circuit 108 may calculate illuminance data on the basis of statistical values (for example, mean, median, mode) of pixel signals from predetermined pixels. The statistical value may be interpolated by any linear or non-linear operation. Note that the illuminance detection and the calculation may be performed outside the solid-state imaging element 100.

The controller 130 obtains the illuminance data from the signal processing circuit 108, and changes the setting of a DAC 104 and/or capacitor units 120a and 120b on the basis of setting data from the register 140. For example, in a case where the illuminance is lower than a threshold, the controller 130 increases the capacitances of input capacitive elements Cvsla and Cvslb of the capacitor units 120a and 120b to increase the input capacitance gain. In a case where the illuminance is equal to or greater than the threshold, the controller 130 decreases the capacitances of the input capacitive elements Cvsla and Cvslb of the capacitor units 120a and 120b and decreases the input capacitance gain. Note that the controller 130 and the register 140 may be provided inside or outside the solid-state imaging element 100.

Figure 18:
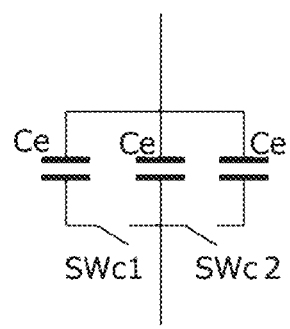
FIG. 18 is a diagram illustrating an example of a configuration of an input capacitive element.

FIG. 18 is a diagram illustrating an example of a configuration of the input capacitive elements Cvsla and Cvslb. The input capacitive elements Cvsla and Cvslb are variable capacitive elements including a plurality of capacitive elements Ce connected in parallel via switches SWc1 and SWc2. A SW control signal from the controller 130 controls the switches SWc1 and SWc2 to be turned on or off to control the number of capacitive elements Ce connected in parallel. As a result, the capacitances of the input capacitive elements Cvsla and Cvslb can be changed. Note that the number of the switches SWc1 and SWc2 and the number of the capacitive elements Ce are not particularly limited. Furthermore, the configuration of FIG. 18 may be applied to the input capacitive elements Crmpa and Crmpb.

FIG. 17 is referred to again. The register 140 stores a threshold of the illuminance in advance, and transmits the threshold as setting data to the controller 130. The register 140 may store a plurality of thresholds. As a result, the controller 130 can control the plurality of switches SWc1 and SWc2 in FIG. 18 to gradually control the capacitances of the input capacitive elements Cvsla and Cvslb. For example, the controller 130 may turn on the switch SWc1 in a case where the illuminance falls below the first threshold, and the controller 130 may further turn on the switch SWc2 when the illuminance further falls below the second threshold (<the first threshold).

After the controller 130 sets the input capacitance gains of the capacitor units 120a and 120b, the pixel unit 101 executes imaging with the set input capacitance gain, and the signal processing circuit 108 converts the pixel signal and outputs image data.

Figure 19:
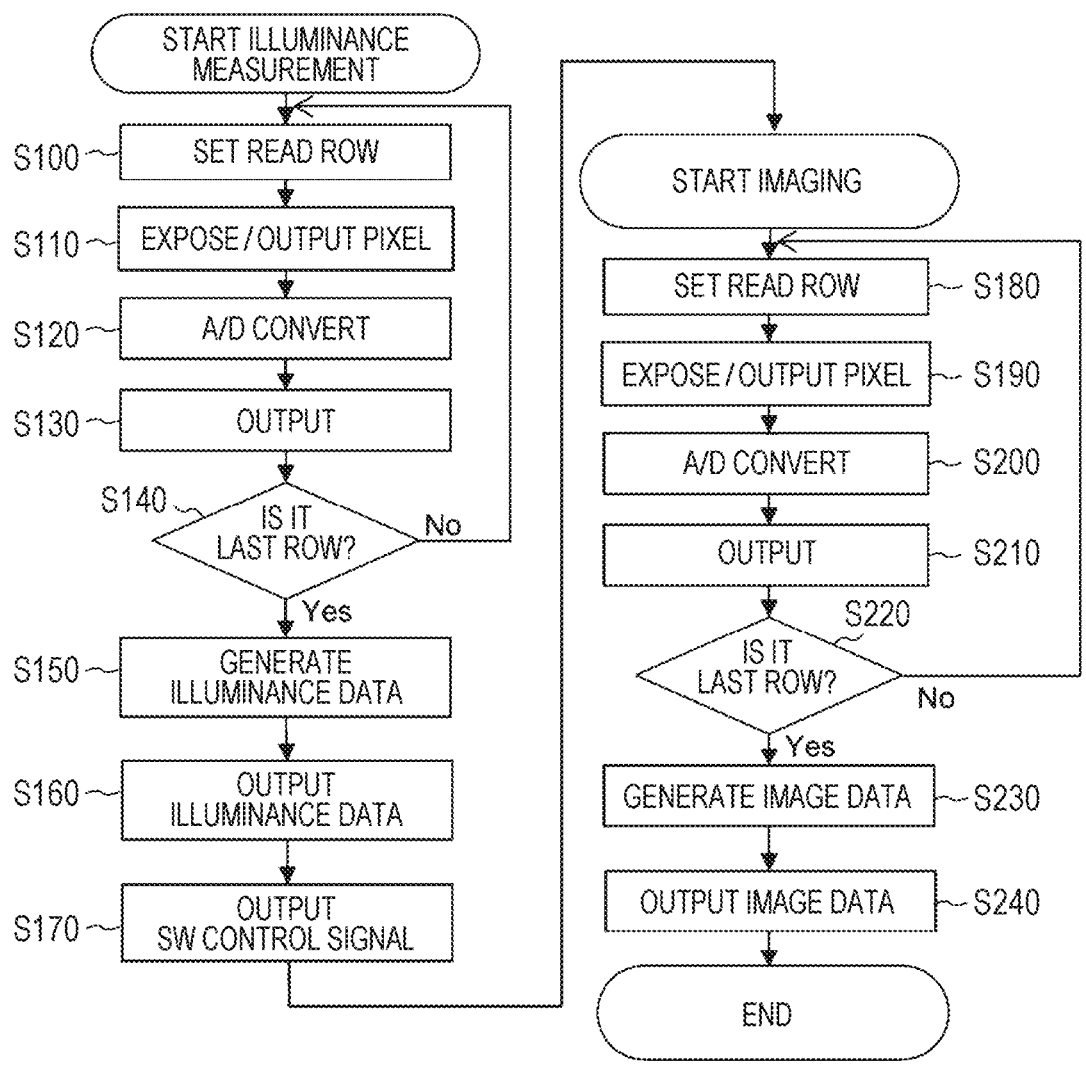
FIG. 19 is a flowchart illustrating operation of the solid-state imaging element according to the fifth embodiment.

FIG. 19 is a flowchart illustrating operation of the solid-state imaging element 100 according to the fifth embodiment. The solid-state imaging element 100 measures the illuminance of the irradiation light to the pixel unit 101 for each frame, and then executes imaging.

In imaging of a certain frame, first, a vertical scanning circuit 103 sets a read row of the pixel unit 101 (S100). Next, the pixel signal is output on the basis of the irradiation light detected by the pixel row of the pixel unit 101 (S110). Next, the ADC groups 105a and 105b perform AD conversion on the pixel signal (S120). Next, a latch circuit 123 outputs the AD converted illuminance data to the signal processing circuit 108 (S130). Steps 3100 to 3130 are executed up to the last row of the pixel unit 101 (NO in S140).

When the signal processing circuit 108 acquires the illuminance data up to the last row of the pixel unit 101 (YES in S140), the signal processing circuit 108 generates the illuminance data of the entire frame (S150) and outputs the illuminance data to the controller 130 (S160). Next, the controller 130 determines the illuminance on the basis of the setting data from the register 140, and sets and outputs the SW control signal or a DAC control signal corresponding to the illuminance for each pixel row. The input capacitance gains of the capacitor units 120a and 120b are controlled by the SW control signal. Alternatively, the slope of the reference signal RAMP from the DAC 104 is controlled by the DAC control signal.

Next, the solid-state imaging element 100 starts imaging of the frame.

Steps S180 to S220 are similar to steps S100 to S140.

Next, the signal processing circuit 108 generates image data of the entire frame (S230), and outputs the image data to the outside of the solid-state imaging element 100 (S240). As a result, the image data can be generated with a suitable input capacitance gain or the reference signal RAMP according to the illuminance of the irradiation light.

As described above, by repeating illuminance measurement and imaging for each frame, the solid-state imaging element 100 can perform imaging with an optimum gain for each frame. The illuminance measurement is not necessarily executed in each frame, and may be executed every several frames, for example.

In a case where both the measurement of the illuminance and the imaging are performed using the pixel unit 101, the controller 130 may switch the input capacitance gains of the capacitor units 120a and 120b between a measurement mode for measuring the illuminance and an imaging mode for imaging an image. For example, in the measurement mode, since it is sufficient to detect the pixel signal with low sensitivity and in a short time, the controller 130 may decrease the input capacitance gain. Alternatively, in the measurement mode, the signal processing circuit 108 may select the output signal OUTa obtained using a low gain.

The controller 130 may control the DAC 104 together with or instead of the switches SWc1 and SWc2. For example, the controller 130 changes the slope of the reference signal RAMP by the DAC control signal. As a result, the slope of the reference signal RAMP can be changed according to the illuminance of the irradiation light, and the operation as in Modification 3 described above can be performed.

Furthermore, in the first to fourth embodiments, the signal processing circuit 108 selects the output signals OUTa and OUTb. In this case, the signal processing circuit 108 may select the output signals OUTa and OUTb according to the detected illuminance.

The technology according to the present disclosure (present technology) can be applied to various products. For example, the technology according to the present disclosure may be achieved as a device mounted on any kind of a moving object such as an automobile, an electric vehicle, a hybrid electric vehicle, an automatic two-wheel vehicle, a bicycle, a personal mobility, an airplane, a drone, a ship, or a robot.

Figure 20:
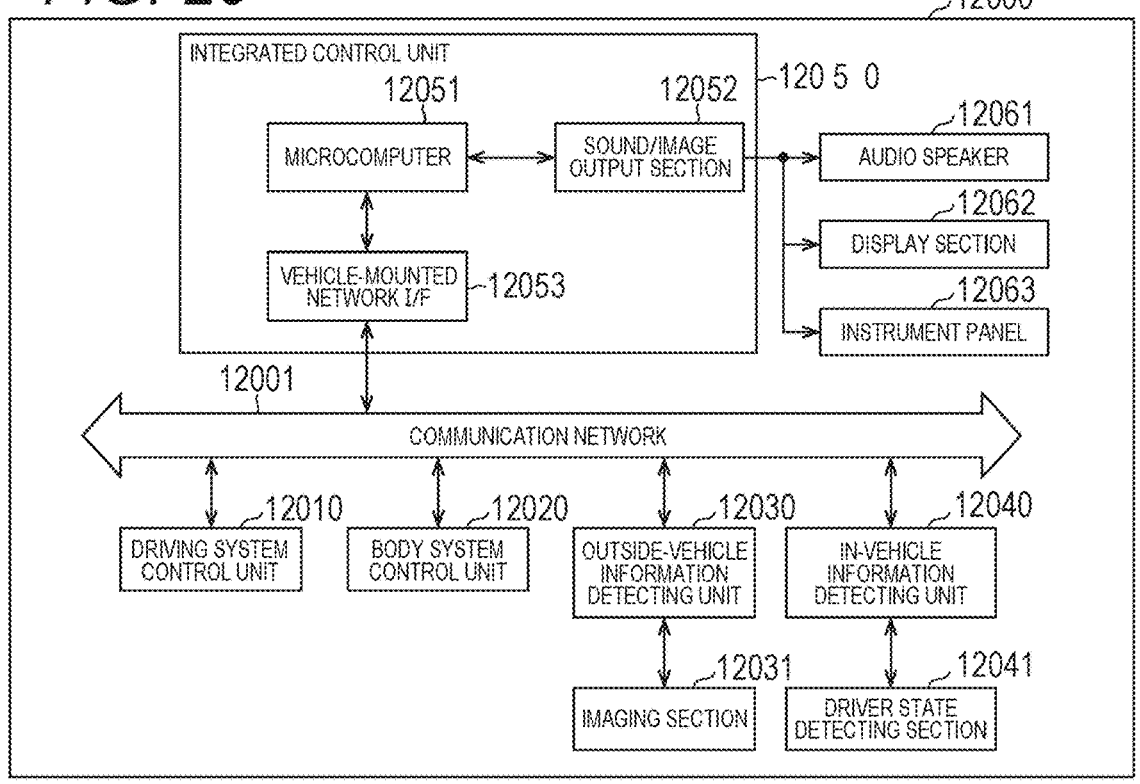
FIG. 20 is a block diagram illustrating a schematic configuration example of a vehicle control system as an example of a mobile body control system to which the technology according to the present disclosure can be applied.

FIG. 20 is a block diagram illustrating an example of schematic configuration of a vehicle control system as an example of a mobile body control system to which the technology according to the present disclosure can be applied.

The vehicle control system 12000 includes a plurality of electronic control units connected to each other via a communication network 12001. In the example illustrated in FIG. 20, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network I/F (interface) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto. The solid-state imaging element 100 according to the present disclosure may be provided in the imaging section 12031.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like. The solid-state imaging element 100 according to the present disclosure may be the imaging section 12031, or may be provided separately from the imaging section 12031.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. An audio speaker 12061, a display section 12062, and an instrument panel 12063 are illustrated as the output device. The display section 12062 may, for example, include at least one of an on-board display and a head-up display.

Figure 21:
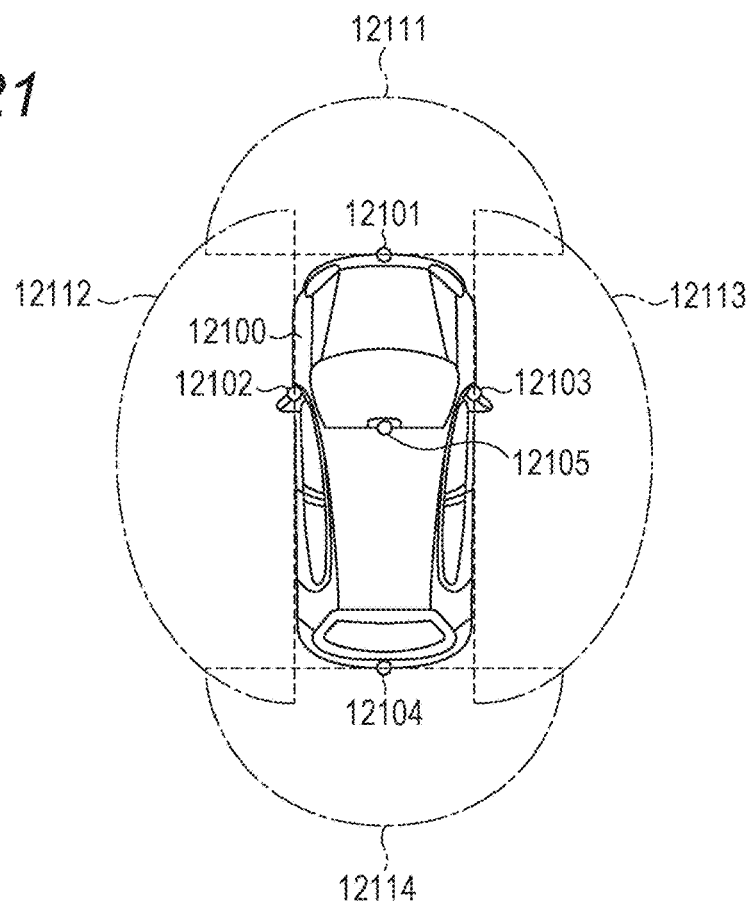
FIG. 21 is a diagram illustrating an example of an installation position of an imaging unit.

FIG. 21 is a diagram illustrating an example of the installation position of the imaging section 12031.

In FIG. 21, the vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The front-side images acquired by the imaging sections 12101 and 12105 are mainly used to detect a preceding vehicle, a pedestrian, an obstacle, a traffic light, a traffic sign, a lane, or the like.

Incidentally, FIG. 21 illustrates an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

As described above, the technology according to the present disclosure can be applied to, for example, the outside-vehicle information detecting unit 12030. Specifically, the above-described imaging section 12031 can be mounted on the outside-vehicle information detecting unit 12030. By applying the technology according to the present disclosure to the imaging section 12031, accurate distance information can be obtained in an environment of a wide brightness dynamic range, and the functionality and safety of the vehicle 12100 can be improved.

Note that the present technology can have configurations as described below.

(1)

A solid-state imaging element including:
a pixel unit including a plurality of pixels;
a pixel signal line that transmits a pixel signal of the pixel;
a reference signal line that transmits a reference signal to be compared with the pixel signal;
a first comparator that outputs a first output signal according to the pixel signal on the basis of a voltage difference between the pixel signal and the reference signal;
a second comparator that outputs a second output signal according to the pixel signal on the basis of the voltage difference between the pixel signal and the reference signal;
a first capacitor unit provided between the pixel signal line or the reference signal line and the first comparator and set to a first gain; and
a second capacitor unit provided between the pixel signal line or the reference signal line and the second comparator and set to a second gain.

(2)

The solid-state imaging element according to (1), in which the first capacitor unit includes a first input capacitive element provided between the reference signal line and the first comparator, and
a second input capacitive element provided between the pixel signal line and the first comparator, and
the second capacitor unit includes a third input capacitive element provided between the reference signal line and the second comparator, and
a fourth input capacitive element provided between the pixel signal line and the second comparator.

(3)

The solid-state imaging element according to (2), in which a capacitance ratio between the first input capacitive element and the second input capacitive element is different from a capacitance ratio between the third input capacitive element and the fourth input capacitive element.

(4)

The solid-state imaging element according to (2) or (3), in which capacitances of the first and third input capacitive elements are substantially equal, and capacitances of the second and fourth input capacitive elements are different from each other.

(5)

The solid-state imaging element according to (3) or (4), in which a gain of the first capacitor unit is determined by the capacitance ratio between the first input capacitive element and the second input capacitive element, and
a gain of the second capacitor unit is determined by the capacitance ratio between the third input capacitive element and the fourth input capacitive element.

(6)

The solid-state imaging element according to any one of (2) to (5), in which one end of each of the first and third input capacitive elements is commonly connected to the reference signal line,
one end of each of the second and fourth input capacitive elements is commonly connected to the pixel signal line,
the first comparator includes a first transistor having a gate commonly connected to the other ends of the first and second input capacitive elements, and
the second comparator includes a second transistor having a gate commonly connected to the other ends of the third and fourth input capacitive elements.

(7)

The solid-state imaging element according to (6), in which the first comparator further includes a first constant current source connected to one end of the first transistor, and outputs the first output signal from between the first transistor and the first constant current source, and
the second comparator further includes a second constant current source connected to one end of the second transistor, and outputs the second output signal from between the second transistor and the second constant current source.

(8)

The solid-state imaging element according to (6), in which the first comparator further includes a first constant current source connected to one end of the first transistor, a third transistor having one end connected to the first constant current source, and a first mirror circuit connected to the other ends of the first and third transistors, and outputs the first output signal from between the third transistor and the first mirror circuit, and
the second comparator further includes a second constant current source connected to one end of the second transistor, a fourth transistor having one end connected to the second constant current source, and a second mirror circuit connected to the other ends of the first and fourth transistors, and outputs the second output signal from between the fourth transistor and the second mirror circuit.

(9)

The solid-state imaging element according to (2), in which the first comparator includes the first transistor having a gate connected to the first input capacitive element and one end connected to the second input capacitive element, and
the second comparator includes the second transistor having a gate connected to the third input capacitive element and one end connected to the fourth input capacitive element.

(10)

The solid-state imaging element according to (9), in which the first and third input capacitive elements are commonly connected to the reference signal line, and
one ends of the first and second transistors receive the pixel signal via the second and fourth input capacitive elements, respectively.

(11)

The solid-state imaging element according to any one of (2) to (10), further including a reference signal generator that supplies the same reference signal to the first and third input capacitive elements.

(12)

The solid-state imaging element according to any one of (1) to (10), further including a signal processing circuit that selects the first output signal or the second output signal according to an illuminance of irradiation light to the pixel unit and outputs the selected signal as image data.

(13)

The solid-state imaging element according to any one of (1) to (12), further including a controller that changes an exposure time of the pixel unit according to the illuminance of the irradiation light to the pixel unit.

(14)

The solid-state imaging element according to any one of (1) to (13), further including a controller that controls a slope of the reference signal according to the illuminance of the irradiation light to the pixel unit.

(15)

The solid-state imaging element according to any one of (1) to (14), further including a controller that controls the first gain or the second gain according to the illuminance of the irradiation light to the pixel unit.

(16)

The solid-state imaging element according to any one of (1) to (10), further including:
  a signal processing circuit (108) that acquires the illuminance of the irradiation light to the pixel unit; and
  a controller (130) that sets the first or second gain according to the illuminance,
  in which the pixel unit executes imaging with the set first or second gain to generate the pixel signal, and
  the signal processing circuit converts the pixel signal to generate image data.

(17)

The solid-state imaging element according to any one of (2) to (5), in which one end of each of the first and third input capacitive elements is commonly connected to the reference signal line,
  one end of each of the second and fourth input capacitive elements is commonly connected to the pixel signal line,
  the first comparator includes a first transistor having a gate connected to the other end of the first input capacitive element and a third transistor having a gate connected to the other end of the second input capacitive element, and
  the second comparator includes a second transistor having a gate connected to the other end of the third input capacitive element and a fourth transistor having a gate connected to the other end of the fourth input capacitive element.

The present disclosure is not limited to the above-described embodiments, and various modifications can be made without departing from the gist of the present disclosure. The effects described in the present specification are merely examples and are not limited, and other effects may be provided.

REFERENCE SIGNS LIST

101 Pixel unit
150 Pixel
105a, 105b ADC group
110 Vertical signal line
120a, 120b Capacitor unit
121a, 121b Comparator
Crmpa, Cvsla, Crmpb, Cvslb Input capacitive element
Tp1a to Tp5a, Tp1b to Tp5b, Tn1a to Tn5a, Tn1b to Tn5b Transistor

The invention claimed is:

1. A solid-state imaging element comprising:
  a pixel unit including a plurality of pixels;
  a pixel signal line that transmits a pixel signal of a corresponding pixel;
  a reference signal line that transmits a reference signal to be compared with the pixel signal;
  a first comparator that outputs a first output signal according to the pixel signal on a basis of a voltage difference between the pixel signal and the reference signal;
  a second comparator that outputs a second output signal according to the pixel signal on a basis of the voltage difference between the pixel signal and the reference signal;
  a first capacitor unit provided between the pixel signal line or the reference signal line and the first comparator and set to a first gain; and
  a second capacitor unit provided between the pixel signal line or the reference signal line and the second comparator and set to a second gain, wherein
  the first capacitor unit includes a first input capacitive element provided between the reference signal line and the first comparator, and a second input capacitive element provided between the pixel signal line and the first comparator,
  the second capacitor unit includes a third input capacitive element provided between the reference signal line and the second comparator, and a fourth input capacitive element provided between the pixel signal line and the second comparator,
  one end of each of the first and third input capacitive elements is commonly connected to the reference signal line,
  one end of each of the second and fourth input capacitive elements is commonly connected to the pixel signal line,
  the first comparator includes a first transistor having a gate commonly connected to other ends of the first and second input capacitive elements, and
  the second comparator includes a second transistor having a gate commonly connected to other ends of the third and fourth input capacitive elements.

2. The solid-state imaging element according to claim 1, wherein
  a capacitance ratio between the first input capacitive element and the second input capacitive element is different from a capacitance ratio between the third input capacitive element and the fourth input capacitive element.

3. The solid-state imaging element according to claim 2, wherein
  a gain of the first capacitor unit is determined by the capacitance ratio between the first input capacitive element and the second input capacitive element, and a gain of the second capacitor unit is determined by the capacitance ratio between the third input capacitive element and the fourth input capacitive element.

4. The solid-state imaging element according to claim 1, wherein
  capacitances of the first and third input capacitive elements are substantially equal, and capacitances of the second and fourth input capacitive elements are different from each other.

5. The solid-state imaging element according to claim 1, wherein
  the first comparator further includes a first constant current source connected to one end of the first transistor, and outputs the first output signal from between the first transistor and the first constant current source, and
  the second comparator further includes a second constant current source connected to one end of the second transistor, and outputs the second output signal from between the second transistor and the second constant current source.

6. The solid-state imaging element according to claim 1, wherein
the first comparator further includes a first constant current source connected to one end of the first transistor, a third transistor having one end connected to the first constant current source, and a first mirror circuit connected to other ends of the first and third transistors, and outputs the first output signal from between the third transistor and the first mirror circuit, and
the second comparator further includes a second constant current source connected to one end of the second transistor, a fourth transistor having one end connected to the second constant current source, and a second mirror circuit connected to other ends of the first and fourth transistors, and outputs the second output signal from between the fourth transistor and the second mirror circuit.

7. The solid-state imaging element according to claim 1, further comprising
a reference signal generator that supplies a same reference signal to the first and third input capacitive elements.

8. The solid-state imaging element according to claim 1, further comprising
a signal processing circuit that selects the first output signal or the second output signal according to an illuminance of irradiation light to the pixel unit and outputs the selected signal as image data.

9. The solid-state imaging element according to claim 1, further comprising
a controller that changes an exposure time of the pixel unit according to an illuminance of irradiation light to the pixel unit.

10. The solid-state imaging element according to claim 1, further comprising
a controller that controls a slope of the reference signal according to an illuminance of irradiation light to the pixel unit.

11. The solid-state imaging element according to claim 1, further comprising
a controller that controls the first gain or the second gain according to an illuminance of irradiation light to the pixel unit.

12. The solid-state imaging element according to claim 1, wherein
one end of each of the first and third input capacitive elements is commonly connected to the reference signal line,
one end of each of the second and fourth input capacitive elements is commonly connected to the pixel signal line,
the first comparator includes a first transistor having a gate connected to the other end of the first input capacitive element and a third transistor having a gate connected to the other end of the second input capacitive element, and
the second comparator includes a second transistor having a gate connected to the other end of the third input capacitive element and a fourth transistor having a gate connected to the other end of the fourth input capacitive element.

13. A solid-state imaging element comprising:
a pixel unit including a plurality of pixels;
a pixel signal line that transmits a pixel signal of a corresponding pixel;
a reference signal line that transmits a reference signal to be compared with the pixel signal;
a first comparator that outputs a first output signal according to the pixel signal on a basis of a voltage difference between the pixel signal and the reference signal;
a second comparator that outputs a second output signal according to the pixel signal on a basis of the voltage difference between the pixel signal and the reference signal;
a first capacitor unit provided between the pixel signal line or the reference signal line and the first comparator and set to a first gain; and
a second capacitor unit provided between the pixel signal line or the reference signal line and the second comparator and set to a second gain, wherein
the first capacitor unit includes a first input capacitive element provided between the reference signal line and the first comparator, and a second input capacitive element provided between the pixel signal line and the first comparator,
the second capacitor unit includes a third input capacitive element provided between the reference signal line and the second comparator, and a fourth input capacitive element provided between the pixel signal line and the second comparator,
the first comparator includes a first transistor having a gate connected to one ends of the first and second input capacitive elements and one end connected to the pixel signal line, and
the second comparator includes a second transistor having a gate connected to one ends of the third and fourth input capacitive elements and one end connected to the pixel signal line.

14. The solid-state imaging element according to claim 13, wherein
other ends of the first and third input capacitive elements are commonly connected to the reference signal line,
other ends of the second and fourth input capacitive elements are grounded, and
one ends of the first and second transistors receive a same pixel signal from the pixel signal line.

15. A solid-state imaging element comprising:
a pixel unit including a plurality of pixels;
a pixel signal line that transmits a pixel signal of a corresponding pixel;
a reference signal line that transmits a reference signal to be compared with the pixel signal;
a first comparator that outputs a first output signal according to the pixel signal on a basis of a voltage difference between the pixel signal and the reference signal;
a second comparator that outputs a second output signal according to the pixel signal on a basis of the voltage difference between the pixel signal and the reference signal;
a first capacitor unit provided between the pixel signal line or the reference signal line and the first comparator and set to a first gain;
a second capacitor unit provided between the pixel signal line or the reference signal line and the second comparator and set to a second gain;
a signal processing circuit that acquires an illuminance of irradiation light to the pixel unit; and
a controller that sets the first or second gain according to the illuminance, wherein the pixel unit executes imaging with the set first or second gain to generate the pixel signal, and the signal processing circuit converts the pixel signal to generate image data.

* * * * *